(12) United States Patent
Do et al.

(10) Patent No.: US 9,847,253 B2
(45) Date of Patent: Dec. 19, 2017

(54) PACKAGE-ON-PACKAGE USING THROUGH-HOLE VIA DIE ON SAW STREETS

(75) Inventors: Byung Tai Do, Singapore (SG); Heap Hoe Kuan, Singapore (SG); Seng Guan Chow, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 1001 days.

(21) Appl. No.: 12/757,750

(22) Filed: Apr. 9, 2010

(65) Prior Publication Data

US 2010/0193931 A1 Aug. 5, 2010
US 2012/0199963 A9 Aug. 9, 2012

Related U.S. Application Data

(60) Division of application No. 11/768,844, filed on Jun. 26, 2007, now Pat. No. 7,723,159, which is a
(Continued)

(51) Int. Cl.
*H01L 21/00* (2006.01)
*H01L 21/768* (2006.01)
(Continued)

(52) U.S. Cl.
CPC .... *H01L 21/76898* (2013.01); *H01L 23/3128* (2013.01); *H01L 23/481* (2013.01);
(Continued)

(58) Field of Classification Search
CPC . H01L 2224/48227; H01L 2224/16225; H01L 2224/32145; H01L 2924/15311
(Continued)

(56) References Cited

U.S. PATENT DOCUMENTS 5,135,891 A * 8/1992 Ikeno et al. .................... 438/70
5,147,822 A * 9/1992 Yamazaki et al. ............ 438/127
(Continued)

FOREIGN PATENT DOCUMENTS

JP H05211202 A 8/1993
KR 1020000061035 10/2000
(Continued)

OTHER PUBLICATIONS

Jiang et al., "Characterization of Epoxy Resin SU-8 Film Using Thickness-Shear Mode (TSM) Resonator", 2003 IEEE International Frequency Control Symposium and PDA Exhibition Jointly with the 17th European Frequency and Time Forum, May 4-8, 2003, pp. 986-992.

*Primary Examiner* — Zandra Smith
*Assistant Examiner* — John M Parker
(74) *Attorney, Agent, or Firm* — Robert D. Atkins; Atkins and Associates, P.C.

(57) ABSTRACT

A semiconductor package-on-package (PoP) device includes a first die incorporating a through-hole via (THV) disposed along a peripheral surface of the first die. The first die is disposed over a substrate or leadframe structure. A first semiconductor package is electrically connected to the THV of the first die, or electrically connected to the substrate or leadframe structure. An encapsulant is formed over a portion of the first die and the first semiconductor package.

30 Claims, 31 Drawing Sheets

Related U.S. Application Data continuation-in-part of application No. 11/744,657, filed on May 4, 2007, now Pat. No. 7,569,421.

(51) Int. Cl.
*H01L 23/31* (2006.01)
*H01L 23/48* (2006.01)
*H01L 23/00* (2006.01)
*H01L 25/03* (2006.01)
*H01L 25/065* (2006.01)
*H01L 25/10* (2006.01)
*H01L 23/538* (2006.01)

(52) U.S. Cl.
CPC .............. *H01L 24/18* (2013.01); *H01L 25/03* (2013.01); *H01L 25/0657* (2013.01); *H01L 25/105* (2013.01); *H01L 23/5389* (2013.01); *H01L 24/45* (2013.01); *H01L 24/48* (2013.01); *H01L 24/73* (2013.01); *H01L 2224/04042* (2013.01); *H01L 2224/05554* (2013.01); *H01L 2224/16* (2013.01); *H01L 2224/18* (2013.01); *H01L 2224/32225* (2013.01); *H01L 2224/32245* (2013.01); *H01L 2224/45139* (2013.01); *H01L 2224/48091* (2013.01); *H01L 2224/48225* (2013.01); *H01L 2224/48227* (2013.01); *H01L 2224/48247* (2013.01); *H01L 2224/48465* (2013.01); *H01L 2224/48472* (2013.01); *H01L 2224/73265* (2013.01); *H01L 2225/06513* (2013.01); *H01L 2225/06524* (2013.01); *H01L 2225/1023* (2013.01); *H01L 2225/1041* (2013.01); *H01L 2225/1058* (2013.01); *H01L 2225/1088* (2013.01); *H01L 2924/00014* (2013.01); *H01L 2924/014* (2013.01); *H01L 2924/01005* (2013.01); *H01L 2924/01006* (2013.01); *H01L 2924/01013* (2013.01); *H01L 2924/01015* (2013.01); *H01L 2924/01027* (2013.01); *H01L 2924/01029* (2013.01); *H01L 2924/01033* (2013.01); *H01L 2924/01047* (2013.01); *H01L 2924/01074* (2013.01); *H01L 2924/01078* (2013.01); *H01L 2924/01082* (2013.01); *H01L 2924/09701* (2013.01); *H01L 2924/10161* (2013.01); *H01L 2924/12044* (2013.01); *H01L 2924/14* (2013.01); *H01L 2924/15311* (2013.01); *H01L 2924/181* (2013.01); *H01L 2924/1815* (2013.01); *H01L 2924/19107* (2013.01)

(58) Field of Classification Search
USPC ....... 438/106, 107, 112, 126, 127, 667, 698; 257/E21.597
See application file for complete search history.

(56) References Cited

U.S. PATENT DOCUMENTS

| | | | |
|---|---|---|---|
| 5,161,090 A | 11/1992 | Crawford et al. | |
| 5,250,843 A | 10/1993 | Eichelberger | |
| 5,258,648 A | 11/1993 | Lin | |
| 5,353,498 A | 10/1994 | Fillion et al. | |
| 5,619,070 A | 4/1997 | Kozono | |
| 5,694,551 A | 12/1997 | Doyle et al. | |
| 5,841,193 A | 11/1998 | Eichelberger | |
| 6,157,915 A | 12/2000 | Bhaskaran et al. | |
| 6,420,244 B2 | 7/2002 | Lee | |
| 6,506,632 B1 | 1/2003 | Cheng et al. | |
| 6,611,052 B2 | 8/2003 | Poo et al. | |
| 6,743,696 B2 | 6/2004 | Jeung et al. | |
| 6,790,710 B2 | 9/2004 | McLellan et al. | |
| 6,800,930 B2 | 10/2004 | Jackson et al. | |
| 6,852,607 B2 | 2/2005 | Song et al. | |
| 6,856,023 B2 | 2/2005 | Muta et al. | |
| 6,867,471 B2 | 3/2005 | Goller et al. | |
| 6,914,327 B2 | 7/2005 | Shizuno | |
| 6,943,056 B2 | 9/2005 | Nemoto | |
| 6,949,407 B2 | 9/2005 | Jeung et al. | |
| 7,061,088 B2 | 6/2006 | Karnezos | |
| 7,064,426 B2 | 6/2006 | Karnezos | |
| 7,121,747 B2 | 10/2006 | Hayashi et al. | |
| 7,364,945 B2 | 4/2008 | Shim et al. | |
| 7,372,141 B2 | 5/2008 | Karnezos et al. | |
| 7,404,199 B2 | 7/2008 | Arneson et al. | |
| 7,517,722 B2 | 4/2009 | Goller et al. | |
| 7,550,857 B1 | 6/2009 | Longo et al. | |
| 7,619,901 B2 | 11/2009 | Eichelberger et al. | |
| 7,687,318 B2 | 3/2010 | Do et al. | |
| 7,791,206 B2 | 9/2010 | Takeuchi et al. | |
| 2002/0013721 A1 | 1/2002 | Dabbiere et al. | |
| 2002/0019761 A1 | 2/2002 | Lidow | |
| 2002/0042755 A1 | 4/2002 | Kumar et al. | |
| 2002/0049622 A1 | 4/2002 | Lettich et al. | |
| 2002/0167084 A1 | 11/2002 | Coccioli et al. | |
| 2004/0035840 A1 | 2/2004 | Koopmans | |
| 2004/0119152 A1 | 6/2004 | Karnezos et al. | |
| 2004/0227251 A1 | 11/2004 | Yamaguchi | |
| 2005/0012195 A1 | 1/2005 | Go et al. | |
| 2005/0046002 A1 | 3/2005 | Lee et al. | |
| 2005/0051883 A1* | 3/2005 | Fukazawa | 257/686 |
| 2005/0067680 A1 | 3/2005 | Boon et al. | |
| 2005/0104181 A1* | 5/2005 | Lee et al. | 257/686 |
| 2005/0184377 A1 | 8/2005 | Takeuchi et al. | |
| 2005/0212106 A1 | 9/2005 | Kwon et al. | |
| 2006/0012038 A1 | 1/2006 | Miyazaki et al. | |
| 2006/0060984 A1 | 3/2006 | Wakabayashi et al. | |
| 2006/0071347 A1 | 4/2006 | Dotta | |
| 2007/0108625 A1 | 5/2007 | Hsu | |
| 2007/0181989 A1 | 8/2007 | Corisis et al. | |
| 2008/0054460 A1 | 3/2008 | Hung | |
| 2008/0138935 A1 | 6/2008 | Pu et al. | |
| 2010/0059885 A1 | 3/2010 | Kuan et al. | |

FOREIGN PATENT DOCUMENTS

| | | |
|---|---|---|
| KR | 20040030841 A | 4/2004 |
| KR | 10-0637287 B1 | 10/2006 |
| TW | 200614404 | 9/1994 |
| TW | 200627616 | 10/1994 |

* cited by examiner

US 9,847,253 B2

PACKAGE-ON-PACKAGE USING THROUGH-HOLE VIA DIE ON SAW STREETS

CLAIM TO DOMESTIC PRIORITY

The present invention is a division of U.S. patent application Ser. No. 11/768,844, filed Jun. 26, 2007, now U.S. Pat. No. 7,723,159, which is a continuation-in-part of U.S. patent application Ser. No. 11/744,657, filed May 4, 2007, now U.S. Pat. No. 7,569,421.

CROSS-REFERENCE TO RELATED APPLICATIONS

The present application is related to co-pending U.S. patent application Ser. No. 11/768,825, entitled "Package-in-Package Using Through-Hole Via Die on Saw Streets," filed on Jun. 26, 2007, and co-pending U.S. patent application Ser. No. 11/768,869, entitled "Same Size Through-Hole Via Die Stacked Package," filed Jun. 26, 2007.

FIELD OF THE INVENTION

The present invention relates in general to semiconductor devices and, more particularly, to a through-hole via (THV) stackable semiconductor device.

BACKGROUND OF THE INVENTION

In a growing trend, semiconductor manufacturers have increasingly adopted three-dimensional (3D) interconnects and packaging for semiconductor devices. Three-dimensional interconnects give advantages such as size reduction, reduced interconnect length and integration of devices with different functionality within a respective package.

One of the various ways of implementing 3D interconnects involves the use of THV technology. THVs can be located either within a semiconductor device, or die, or outside the die along a saw street guide.

However, current THV technology poses several limitations. A via located within a semiconductor device restricts the freedom of having additional circuitry within the semiconductor device. As can be appreciated, a respective location of a THV forecloses the placement of circuitry at that location. As a result, the functionality of the semiconductor device, and therefore, a device making use of the semiconductor device, is limited.

A via located outside the semiconductor device, i.e., along the saw street guide, necessitates a wider saw street to accommodate the creation of a through-hole. As a result, yields for semiconductor devices per wafer are reduced.

SUMMARY OF THE INVENTION

In light of the foregoing, the aim of the present invention is to provide a THV stackable semiconductor device without having any of the accompanying limitations previously described. The devices can be incorporated into a variety of package-on-package (PoP) topologies as will be described.

Accordingly, in one embodiment, the present invention is a semiconductor device comprising a first semiconductor die having a plurality of first contact pads formed on a surface of the first semiconductor die. A first organic material is deposited around a peripheral region of the first semiconductor die. A plurality of first conductive THV is formed through the first organic material in the peripheral region around the first semiconductor die. A plurality of conductive traces is formed over the surface of the first semiconductor die respectively between the first conductive THVs and first contact pads. A plurality of first bumps is formed over the first conductive THVs or the surface of the first semiconductor die. A first encapsulant is deposited over the first bumps, first semiconductor die, and first organic material. The first bumps are exposed from the first encapsulant. A second semiconductor die is mounted over the first encapsulant and electrically connected to the first bumps.

In another embodiment, the present invention is a semiconductor device comprising a first semiconductor die and first organic material deposited around a peripheral region of the first semiconductor die. First conductive vias are formed through the first organic material in the peripheral region around the first semiconductor die. A first interconnect structure is formed over the first conductive vias or a surface of the first semiconductor die. A first encapsulant is deposited over the first interconnect structure, first semiconductor die, and first organic material. The first interconnect structure is exposed from the first encapsulant. A second semiconductor die is mounted over the first encapsulant and electrically connected to the first interconnect structure.

In another embodiment, the present invention is a semiconductor device comprising a first semiconductor die and first organic material deposited around a peripheral region of the first semiconductor die. First conductive vias are formed through the first organic material in the peripheral region around the first semiconductor die. A first interconnect structure is formed over the first conductive vias or a surface of the first semiconductor die. A second semiconductor die is mounted over the first semiconductor die and electrically connected to the first interconnect structure.

In another embodiment, the present invention is a semiconductor device comprising a plurality of stacked semiconductor die each including an organic material deposited around a peripheral region of the semiconductor die and plurality of conductive vias formed through the organic material in a peripheral region around the semiconductor die. An interconnect structure is formed over the conductive vias or a surface of the semiconductor die.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

In the following description and claims, the terms "comprise" and "include," along with their derivatives, may be used and are intended as synonyms for each other. In addition, in the following description and claims, the terms "coupled" and "connected," along with their derivatives, may be used. "Connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. However, "over" may also mean that two or more elements are not in direct contact with each other. For example, "over" may mean that one element is above another element but not contact each other and may have another element or elements in between the two elements.

Figure 1:
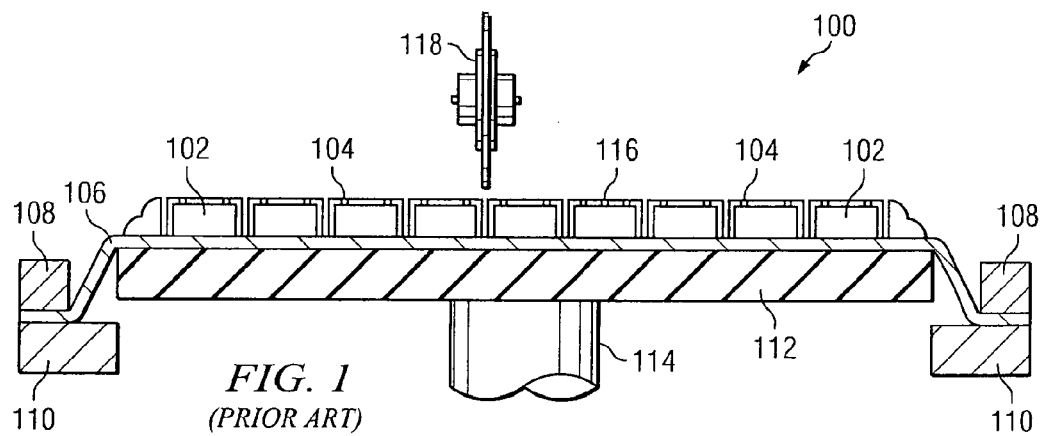
FIG. 1 illustrates an exemplary prior art method of making a wafer level chip scale package.

FIG. 1 illustrates an exemplary prior art method 100 of making a wafer level chip scale package. A plurality of semiconductor devices 102 are cut from a wafer. Each semiconductor device 102 has a plurality of protruding bonding pads 104 located on the active surface of the device.

The plurality of semiconductor devices 102 is disposed on the top surface of a retractable film 106. The retractable film 106 is secured by a frame 108. The frame 108 is fixed by a fixture 110 and retractable film 106 is displaced on a work platform 112 and then stretched.

The platform 112 can move up relative to fixture 110. The wafer is cut by a cutter into the plurality of semiconductor devices 102 as shown, which have been encapsulated into semiconductor packages and then sawn by cutter 118. A shaft 114 moves upward to lift platform 112 relative to fixture 110.

The present invention improves upon the exemplary prior art method 100 of manufacture to render a THV semiconductor device which is, in some embodiments, stacked together for specific applications and implementations.

Figure 2A:
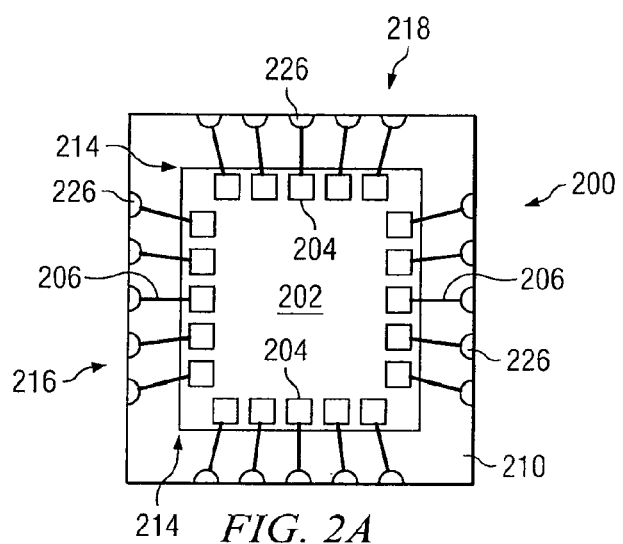
FIGS. 2A and 2B illustrate a first embodiment of a THV stackable semiconductor device in a top and side view, respectively.
Figure 2B:
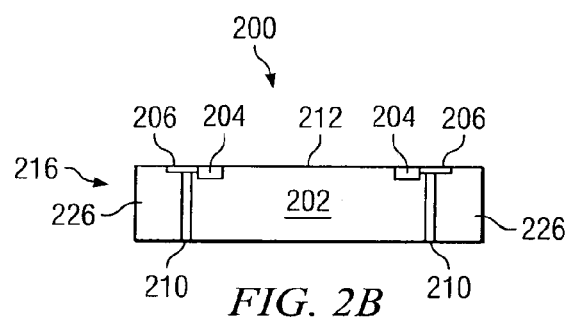

FIGS. 2A and 2B illustrate a first embodiment of a THV stackable semiconductor device 200, in a top and side view, respectively. Device 200 has an incorporated die 202. Device 200 includes a plurality of bond pads 204, which is deposited on an active side of semiconductor die 202. Bonding pads 204 can be deposited on the electrode terminals of die 202 by a plating process, or otherwise. The materials of bonding pads 204 can be made from a conductive metal, such aluminum (Al). Bonding pads 204 can be joined to a substrate by a soldering process.

A series of metal traces 206 electrically couple bond pads 204 to via 226. As shown in FIG. 2B, via 226 extends vertically from the active, top surface 212 of die 202 and surrounding material 210 to a bottom surface of the die and surrounding material 210, which is consistent with a THV design.

The surrounding material 210, which is, for purposes of the present invention, referred to as an "organic material," is deposited around peripheral surface 214 of die 202 as shown. The organic material 210 is an improvement and a departure from that of the prior art, as will be further described. The organic material can include such materials as benzocyclobutene (BCB), polyimide (PI), or similar material. As shown, vias 226 are formed in organic material 210 and organized according to rows. In the present embodiment 200, vias 226 are formed in each side of organic material 210, e.g., sides 216, and 218, so as to completely surround the periphery of die 202. Each of the plurality of bond pads 204 is electrically coupled to each of the plurality of vias 226.

As will be shown, THV 226 can be formed in various configurations, for example, along multiple rows. Further, half-cut vias as shown in the instant figure or complete, uncut vias can be formed in various embodiments to suit particular implementations. The semiconductor device 200 can be stacked or coupled with additional dies 202 in a variety of configurations.

Figure 3A:
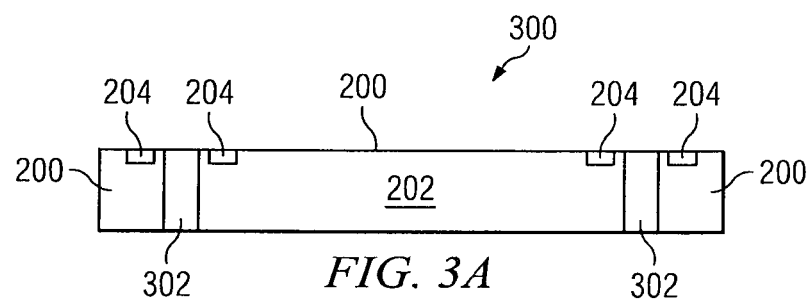
FIGS. 3A and 3B illustrate a first step in a first exemplary method of manufacturing the THV stackable semiconductor device as shown in FIGS. 2A and 2B in a side and top view, respectively.
Figure 3B:
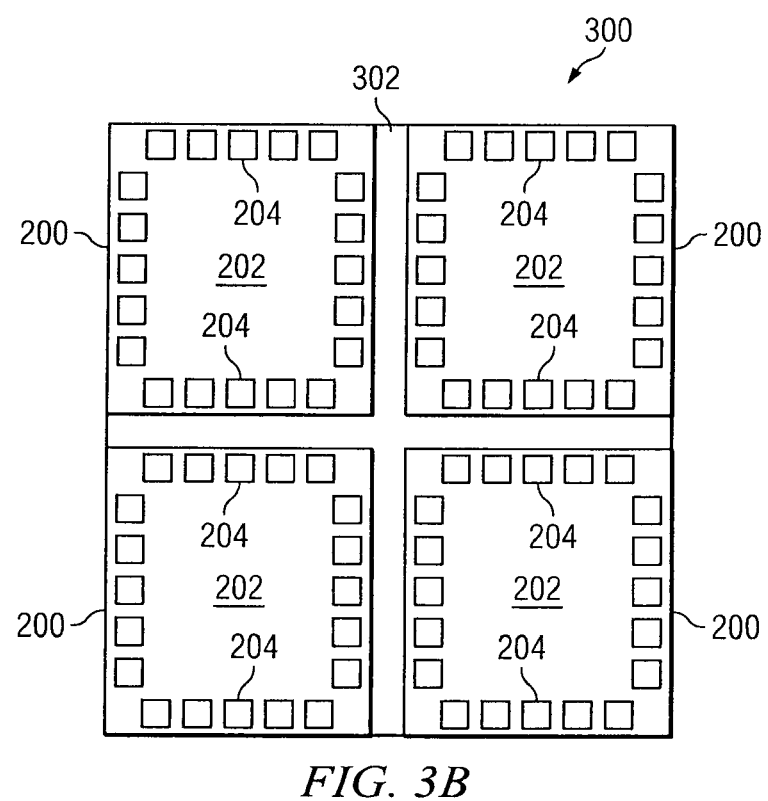

FIGS. 3A and 3B illustrate a first step in a first exemplary method of manufacturing the THV stackable semiconductor device as shown in FIGS. 2A and 2B in a side and top view, respectively. A series of bond pads 204 are formed on an active surface of wafer 300 as shown. The wafer is designated with a saw street guide 302.

Figure 4A:
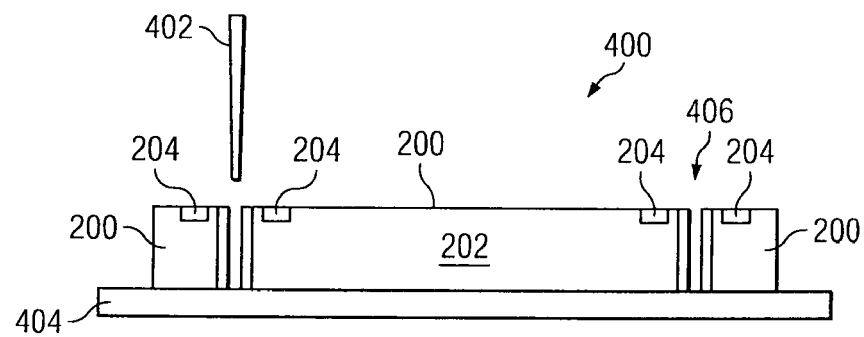
FIGS. 4A and 4B illustrate a second step in a first exemplary method of manufacturing the THV stackable semiconductor device as shown in FIGS. 2A and 2B in a side and top view, respectively.
Figure 4B:
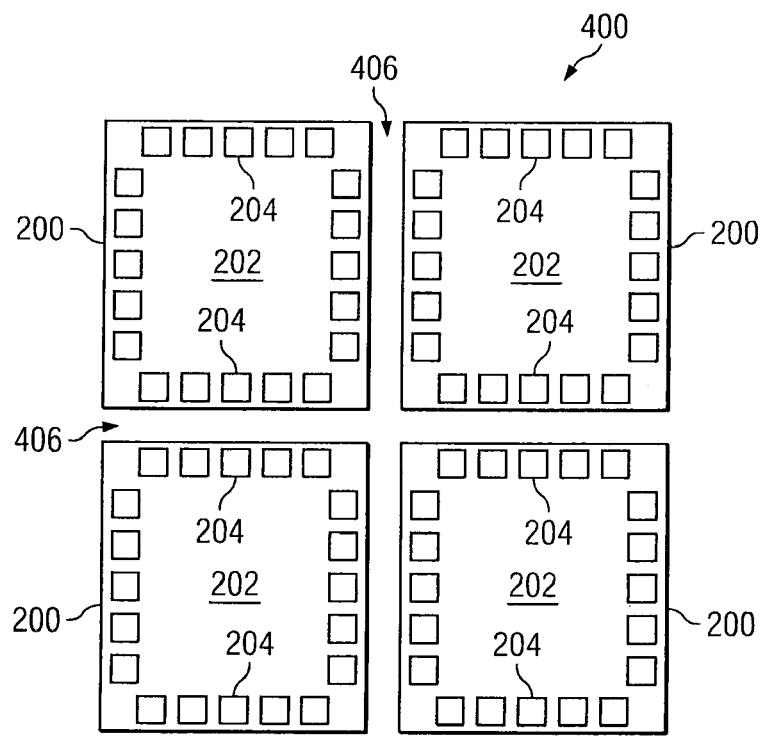

FIGS. 4A and 4B illustrate a second step in the first exemplary method of manufacturing the THV stackable semiconductor device as shown in FIGS. 2A and 2B in a side and top view, respectively. Wafer 300 is singulated into depicted pieces 400 by a cutting source 402. Cutting source 402 can include a saw or laser cutting tool.

Prior to singulation, wafer 300 is placed on a dicing tape 404, which keeps the various segments 400 in place during the singulation process. Subsequent to the singulation process, a series of gaps 406 is formed between respective segments 400 as shown.

Figure 5A:
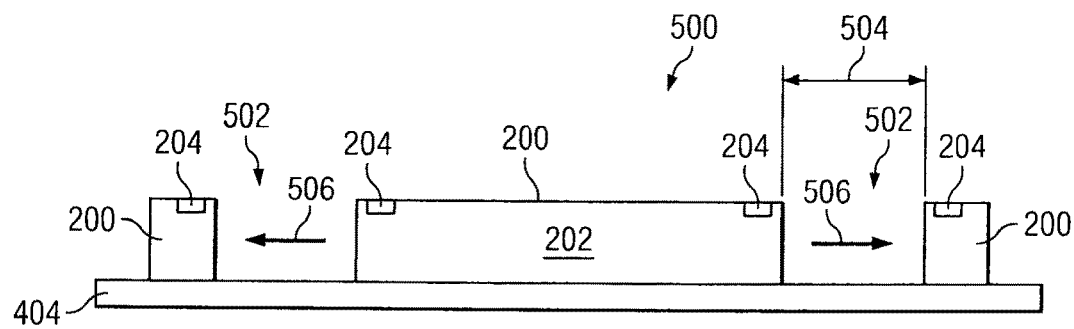
FIGS. 5A and 5B illustrate a third step in a first exemplary method of manufacturing the THV stackable semiconductor device as shown in FIGS. 2A and 2B in a side and top view, respectively.
Figure 5B:
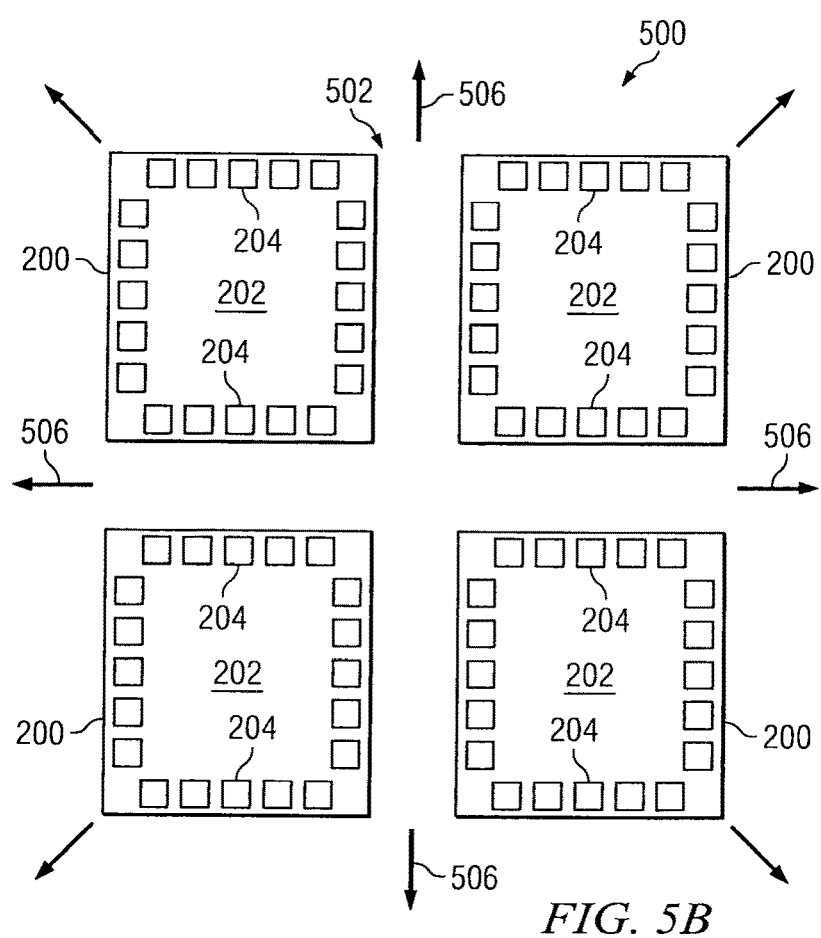

FIGS. 5A and 5B illustrate a third step in the first exemplary method of manufacturing the THV stackable semiconductor device as shown in FIGS. 2A and 2B in a side and top view, respectively. Wafer 300, in the depicted respective segments, undergoes an expansion process. The dicing tape 404 can be stretched by using an expansion table to render a series of gaps 502 having predetermined distances 504. The depicted arrows 506 indicate the various expansion directions undergone by the wafer expansion process.

Figure 6A:
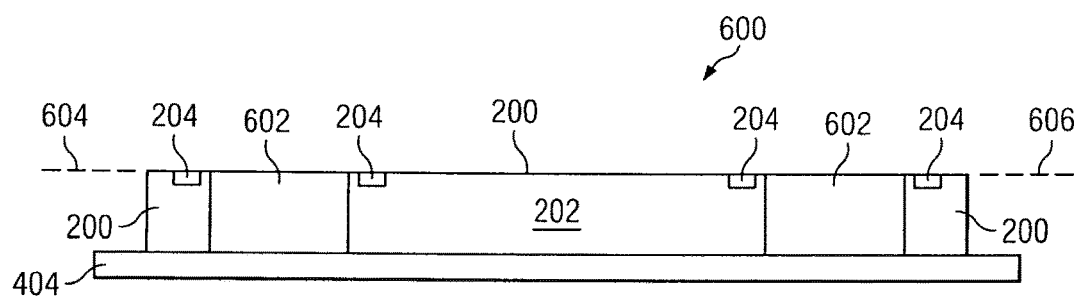
FIGS. 6A and 6B illustrate a fourth step in a first exemplary method of manufacturing the THV stackable semiconductor device as shown in FIGS. 2A and 2B in a side and top view, respectively.
Figure 6B:
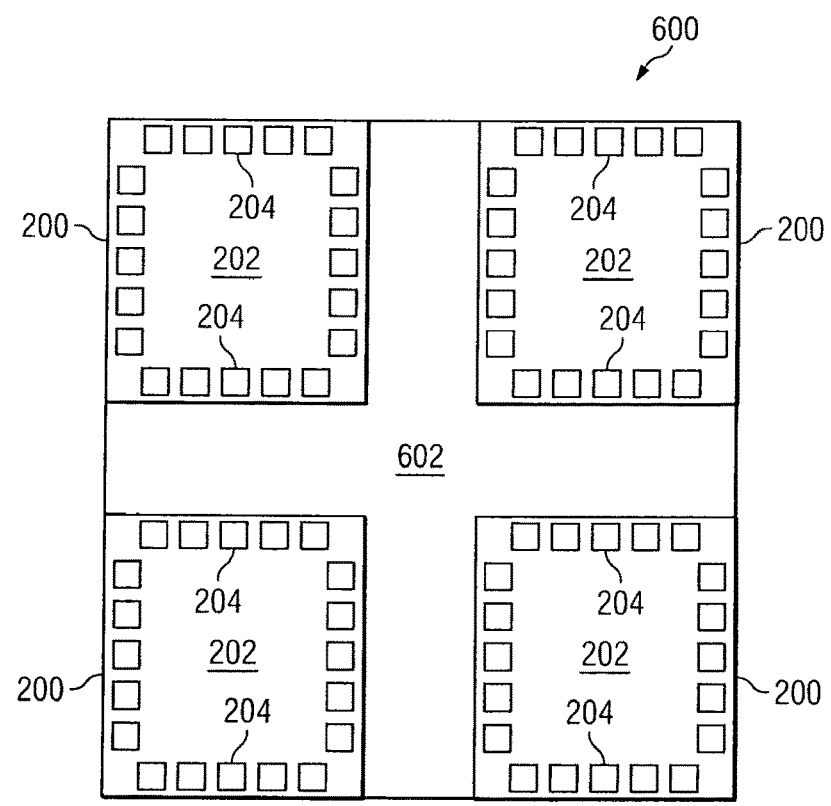

As a next step, FIGS. 6A and 6B illustrate a fourth step in the first exemplary method of manufacturing the THV stackable semiconductor device as shown in FIGS. 2A and 2B in a side and top view, respectively. The various gaps 502 shown in FIGS. 5A and 5B are filled with the previously described organic material 602. A plane 604 corresponding to a top surface of filled segments 600 is substantially coplanar with a plane 606 corresponding to a top surface of organic material 602.

The organic material 602 application can be performed by such methods as spin-coating, needle dispensing, or similar application.

Figure 7A:
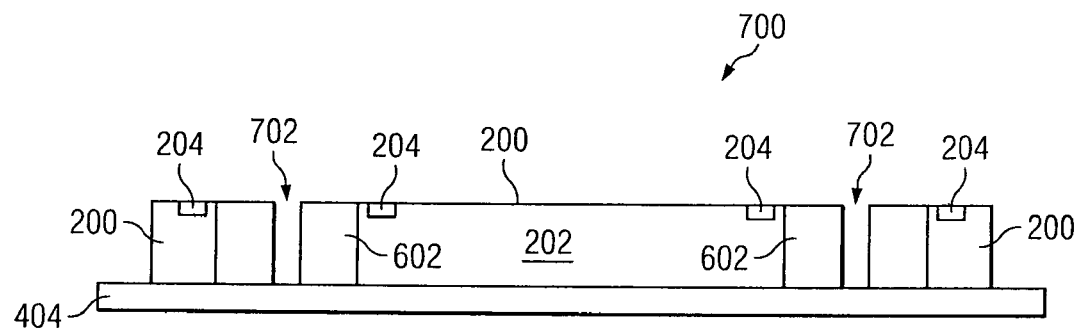
FIGS. 7A and 7B illustrate a fifth step in a first exemplary method of manufacturing the THV stackable semiconductor device as shown in FIGS. 2A and 2B in a side and top view, respectively.
Figure 7B:
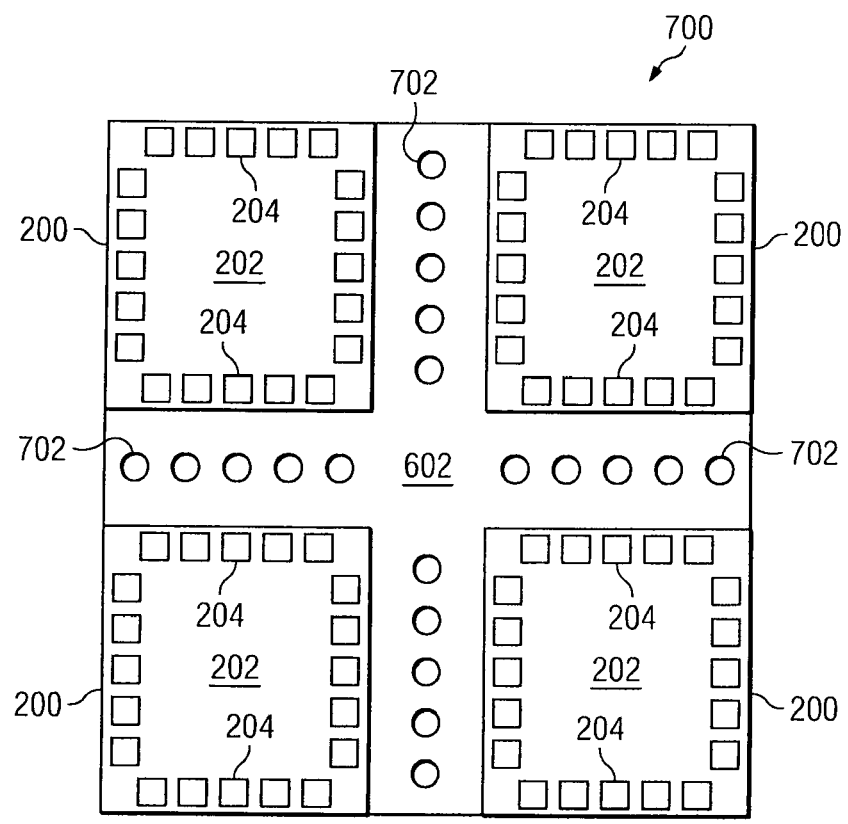

FIGS. 7A and 7B illustrate a fifth step in the first exemplary method of manufacturing the THV stackable semiconductor device as shown in FIGS. 2A and 2B in a side and top view, respectively. Segments 700 undergo a process to form a plurality of via holes 702 in organic material 602 as shown. The via holes can be formed in various processes, including a laser via drilling process or an etching process. As is shown, each of the via holes is configured in organic material 602 to correspond to respective bump pad 204 to which the via hole will be associated.

Figure 8A:
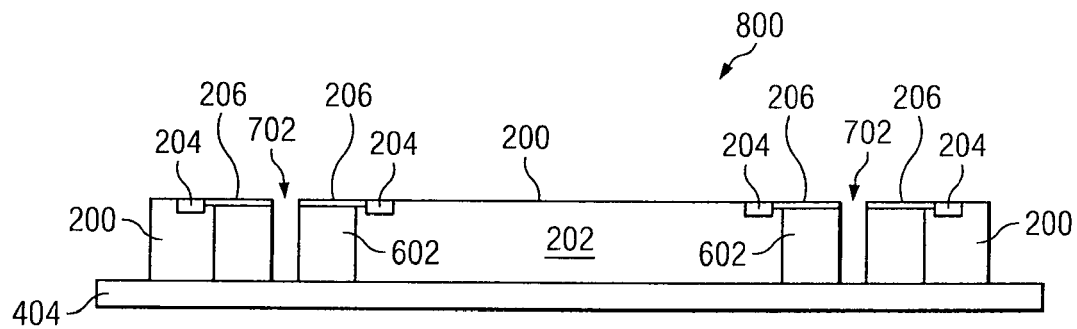
FIGS. 8A and 8B illustrate a sixth step in a first exemplary method of manufacturing the THV stackable semiconductor device as shown in FIGS. 2A and 2B in a side and top view, respectively.
Figure 8B:
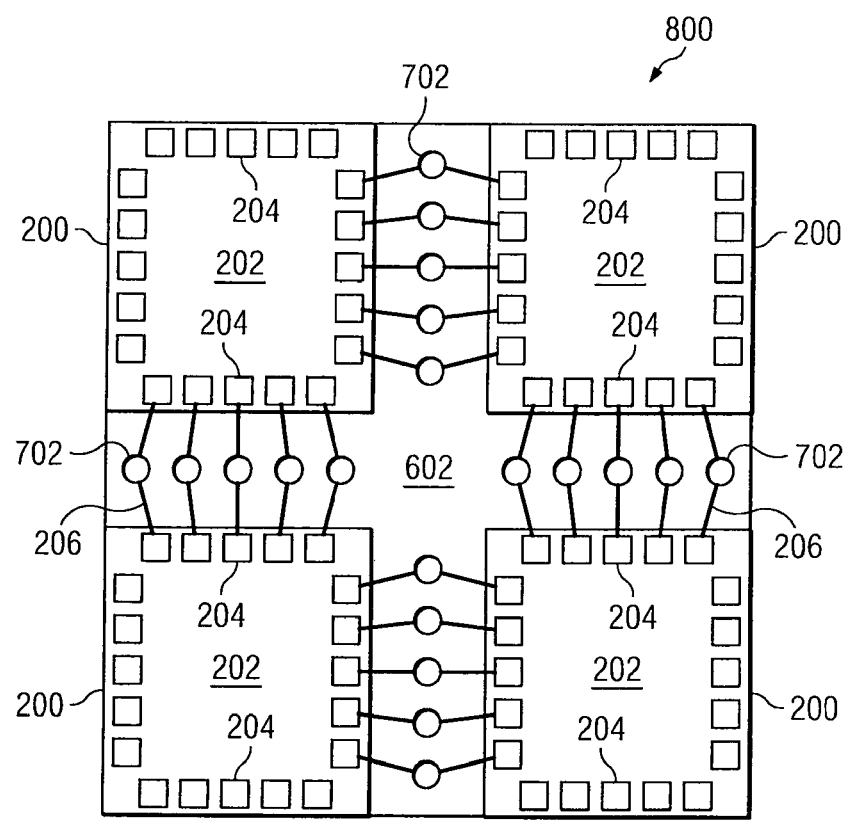

Turning to FIGS. 8A and 8B, a sixth step in the first exemplary method of manufacturing the THV stackable semiconductor device as shown in FIGS. 2A and 2B in a side and top view, respectively, is shown. FIGS. 8A and 8B illustrate a metal patterning process, which connects a series of metal traces 206 from bond pads 204 to via holes 702. Metal traces 206 electrically connect the bond pads to each of via holes 702 locations as shown.

Figure 9A:
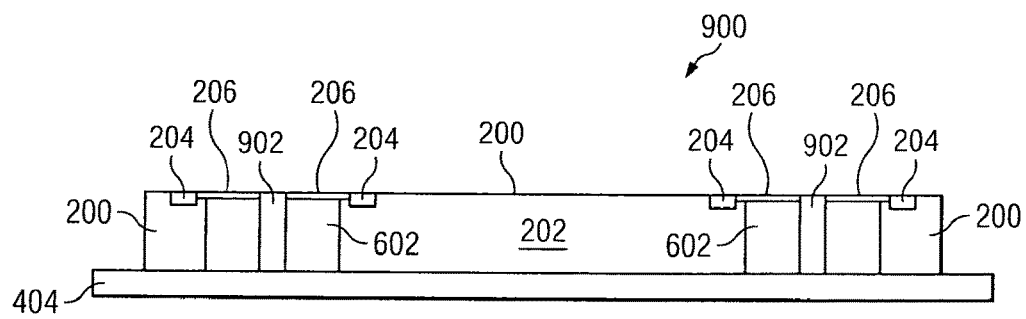
FIGS. 9A and 9B illustrate a seventh step in a first exemplary method of manufacturing the THV stackable semiconductor device as shown in FIGS. 2A and 2B in a side and top view, respectively.
Figure 9B:
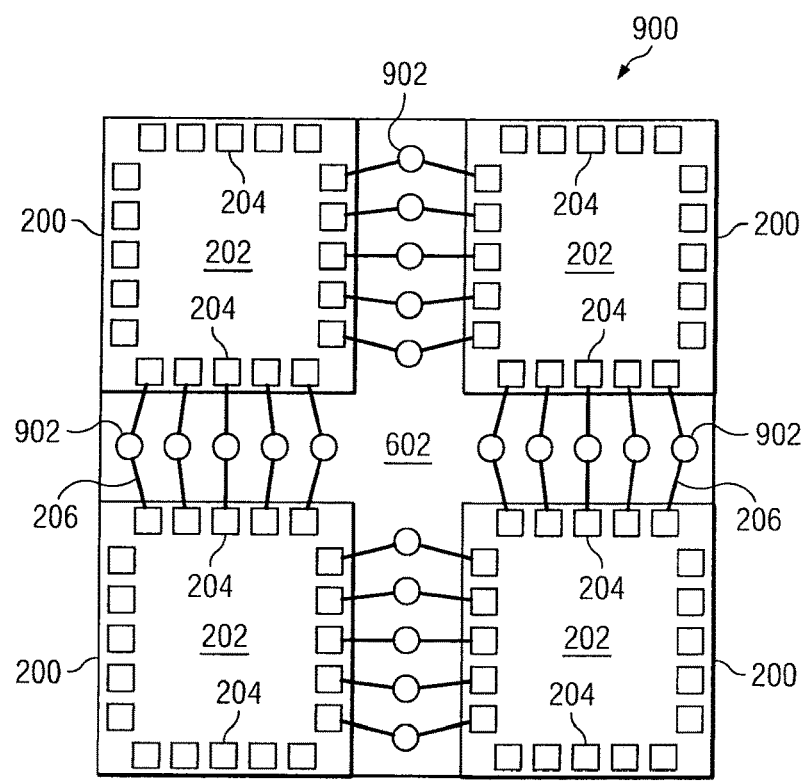

FIGS. 9A and 9B illustrate a seventh step in the first exemplary method of manufacturing the THV stackable semiconductor device as shown in FIGS. 2A and 2B. A via hole metal deposition process is performed to assembly 900 to deposit conductive material into each of via holes 702, forming a series of metal vias 902. The conductive material can be materials such as Al, copper (Cu), tungsten (W), combination of metal alloys, or any other conductive metal. Again, metal vias 902 are formed in organic material 602. A variety of methods and techniques can be used to form the metal vias, such as a plating or plugging process.

Figure 10A:
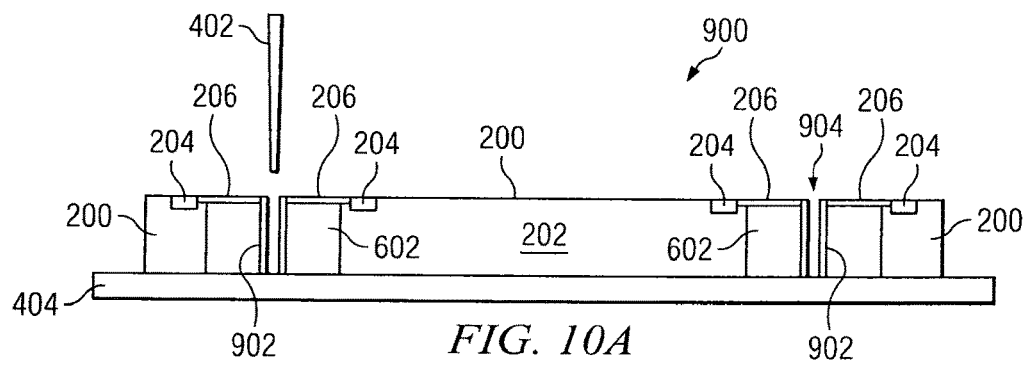
FIGS. 10A and 10B illustrate an eighth step in a first exemplary method of manufacturing the THV stackable semiconductor device as shown in FIGS. 2A and 2B in a side and top view, respectively.
Figure 10B:
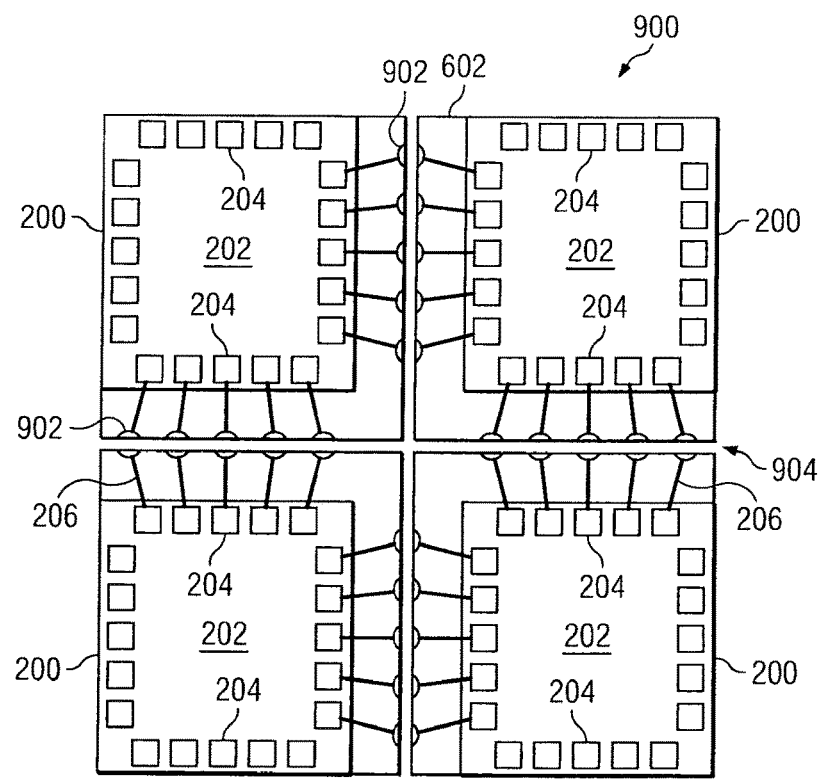

FIGS. 10A and 10B illustrate an eighth step in the first exemplary method of manufacturing the THV stackable semiconductor device as shown in FIGS. 2A and 2B. Wafer assembly 300, and 900 is singulated for a second time by a cutting tool 402 to form gaps 904. The various dies 202 shown in FIGS. 10A, 10B, and the preceding exemplary figures represent a smaller portion of a totality of semiconductor devices, which are yielded from a particular wafer 300. As such, following the conclusion of the second singulation step, a majority of dies 202 are rendered to be like the embodiment shown in FIGS. 2A and 2B, where organic material 210 completely surrounds the peripheral surface of die 202, and THVs 902 are configured in rows along each side surface of the die as previously represented.

In one embodiment, following the singulation step depicted in FIGS. 10A and 10B, individual dies 202 are removed by a die pick and place process to remove each die 202 from dicing tape 404.

Figure 11A:
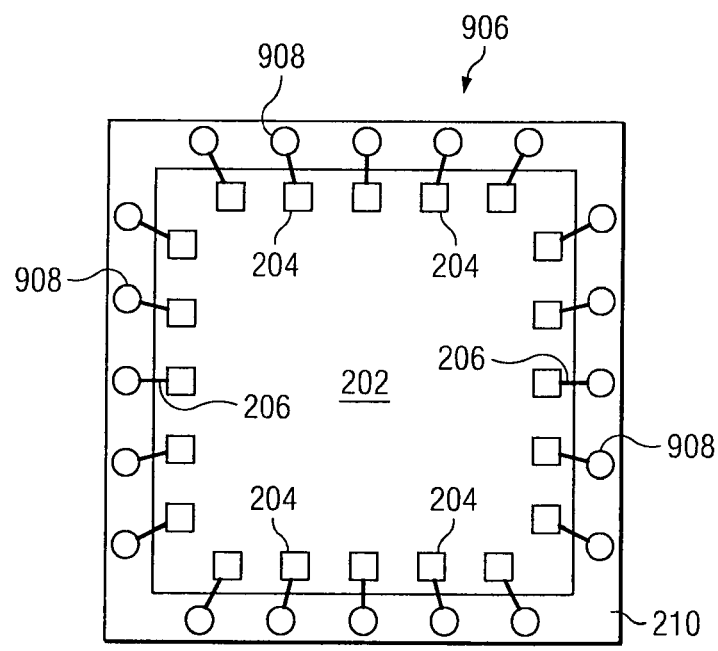
FIGS. 11A and 11B illustrate a second embodiment of a THV stackable semiconductor device incorporating a plurality of complete THVs, as shown in a top and side view, respectively.
Figure 11B:
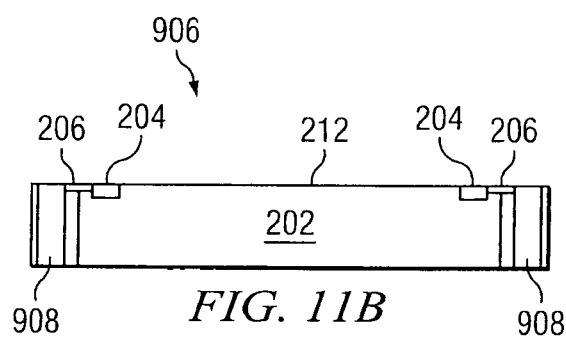

FIGS. 11A and 11B illustrate a second embodiment of a THV stackable semiconductor device 906 incorporating a plurality of complete THVs, as shown in a top and side view, respectively. The various features shown in the previous figures are shown, including die 202, bond pads 204, and metal tracings, which are formed on the active surface 212 of die 202. In the instant embodiment 906, the respective THVs 908 are complete, in lieu of being half-cut as shown in the previous embodiment. The depicted complete THVs 908 can be formed by a particular configuration of saw street guide 302 as shown in FIGS. 3A and 3B. A wider saw street guide 302 allows organic material 602 to be cut as shown, retaining a complete via hole 908.

Figure 12A:
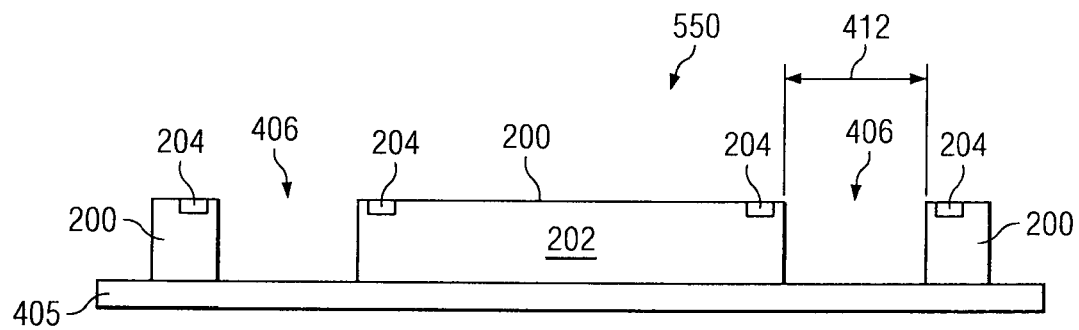
FIGS. 12A and 12B illustrate a third step in a second exemplary method of manufacturing the THV stackable semiconductor device as shown in FIGS. 2A and 2B in a side and top view, respectively.
Figure 12B:
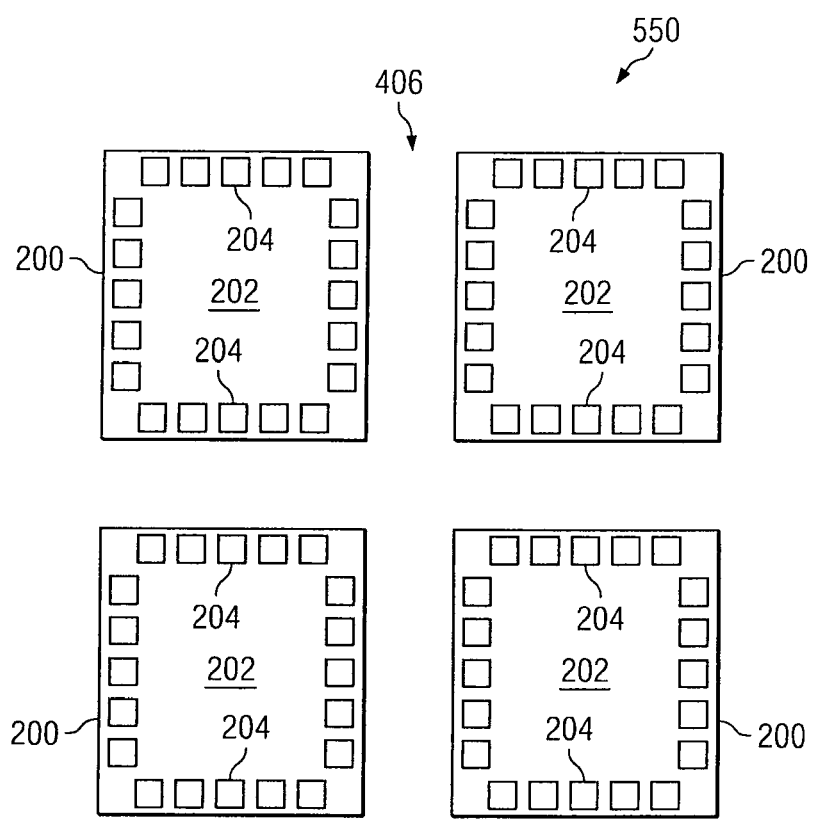

FIGS. 12A and 12B illustrate a third step in a second exemplary method of manufacturing the THV stackable semiconductor device as shown in FIGS. 2A and 2B in a side and top view, respectively. The second method of manufacture as described shares the first two steps, i.e., providing a wafer and singulation into respective segments upon dicing tape 404, as the first exemplary method previously described. In addition, various features such as bond pads 204 are again shown.

As a next step, wafer segments 550 are picked from dicing tape 404 and placed onto a wafer support system 405 as shown. The wafer support system can logically include a second dicing tape 405. However, the wafer support system can also be a temporary wafer support system, such as glass, ceramic, laminate, or silicon (Si) substrate. In one embodiment, sawn dies 202 are picked from dicing tape 404 and placed onto wafer support system 405 using pick and place machines. The pick and place process renders a gap 406 having a predetermined width or distance 412 between respective segments 550.

Figure 13A:
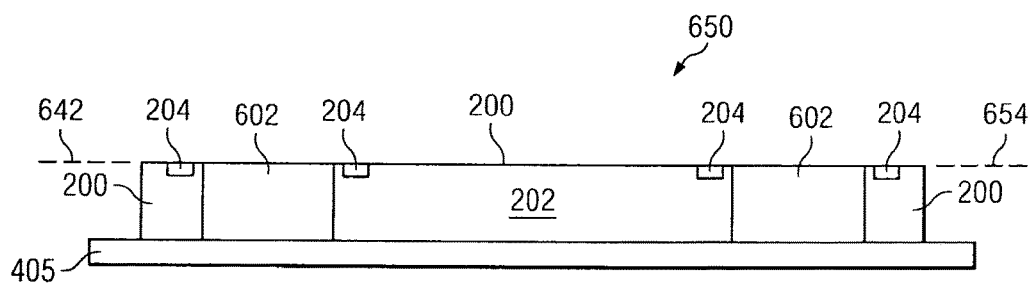
FIGS. 13A and 13B illustrate a fourth step in a second exemplary method of manufacturing the THV stackable semiconductor device as shown in FIGS. 2A and 2B in a side and top view, respectively.
Figure 13B:
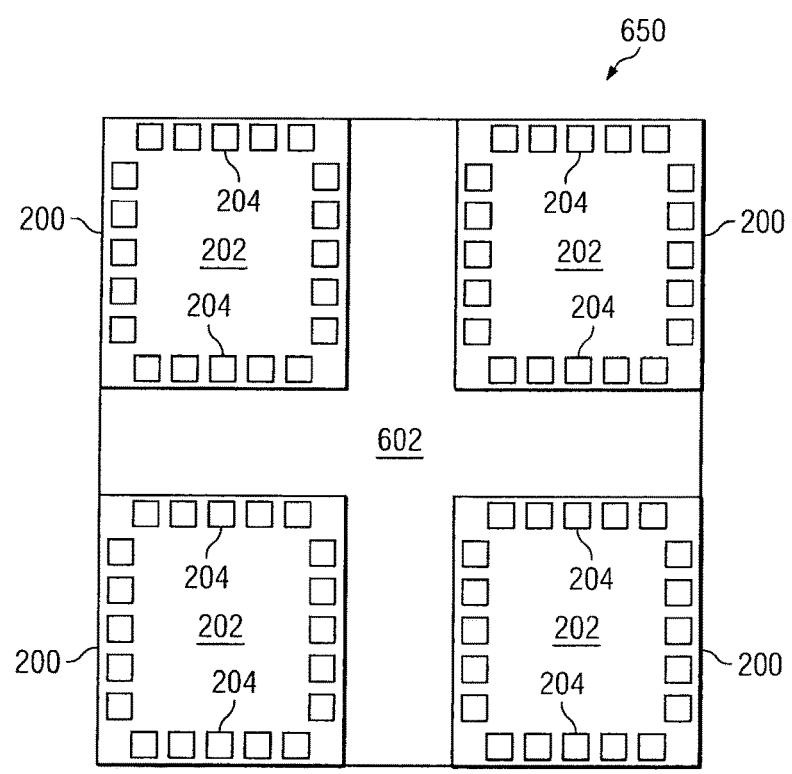

FIGS. 13A and 13B illustrate a fourth step in the second exemplary method of manufacturing the THV stackable semiconductor device as shown in FIGS. 2A and 2B. The organic material 602 is again applied to segments 650 in a similar spin-coating, needle dispensing, or other manner as previously described. Plane 642 of segments 650 is substantially coplanar with plane 654 of organic material 602.

Figure 14A:
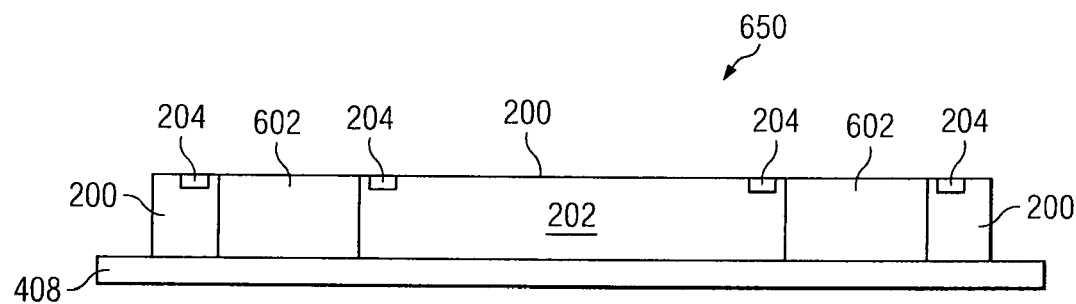
FIGS. 14A and 14B illustrate a fifth step in a second exemplary method of manufacturing the THV stackable semiconductor device as shown in FIGS. 2A and 2B in a side and top view, respectively.
Figure 14B:
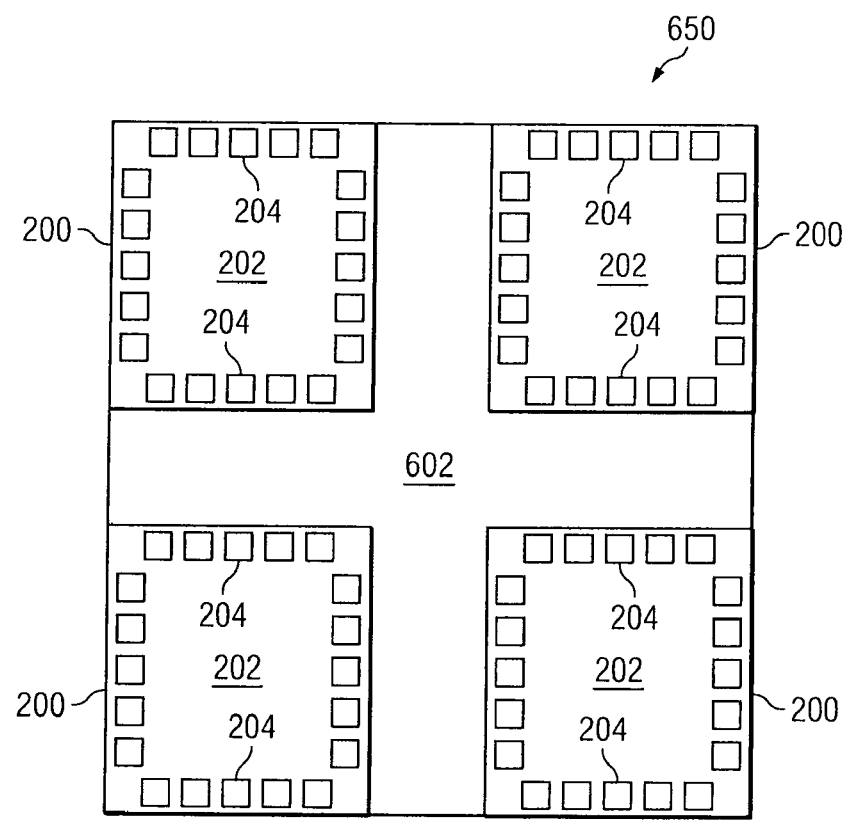

Turning to FIGS. 14A and 14B, a fifth step in the second exemplary method of manufacturing the THV stackable semiconductor device is shown in FIGS. 2A and 2B. The recoated wafer 300 is transferred onto a second wafer support system 408. The second wafer support system can again include glass, Si substrate materials, ceramic, and laminate materials.

Figure 15A:
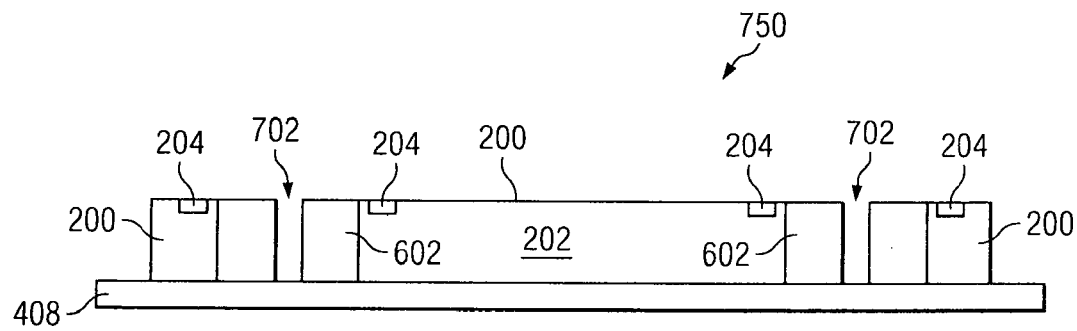
FIGS. 15A and 15B illustrate a sixth step in a second exemplary method of manufacturing the THV stackable semiconductor device as shown in FIGS. 2A and 2B in a side and top view, respectively.
Figure 15B:
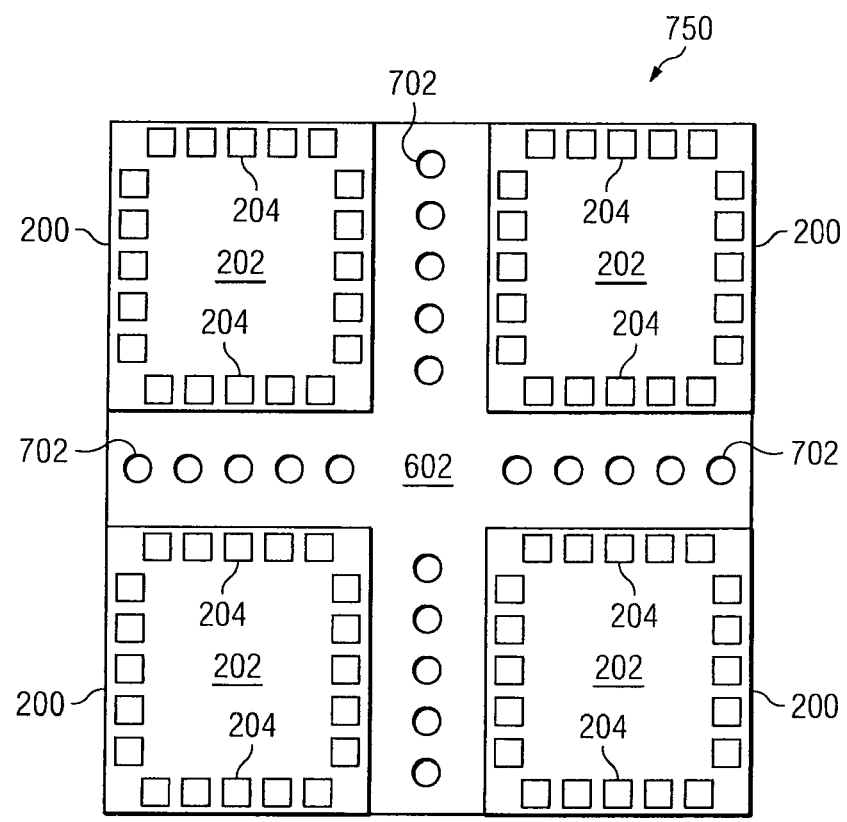

FIGS. 15A and 15B illustrate a sixth step in the second exemplary method of manufacturing the THV stackable semiconductor device as shown in FIGS. 2A and 2B in a side and top view, respectively. In a step 750, similar to that shown in FIGS. 7A and 7B, a plurality of via holes 702, is formed in organic material 602 to coincide with bond pads 204.

Figure 16A:
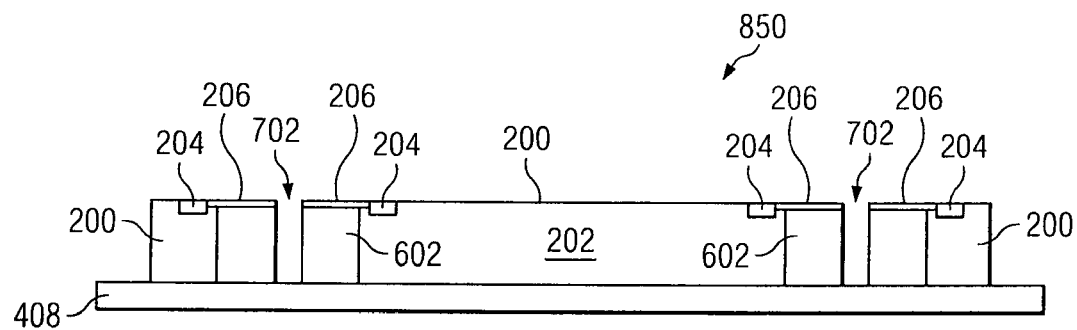
FIGS. 16A and 16B illustrate a seventh step in a second exemplary method of manufacturing the THV stackable semiconductor device as shown in FIGS. 2A and 2B in a side and top view, respectively.
Figure 16B:
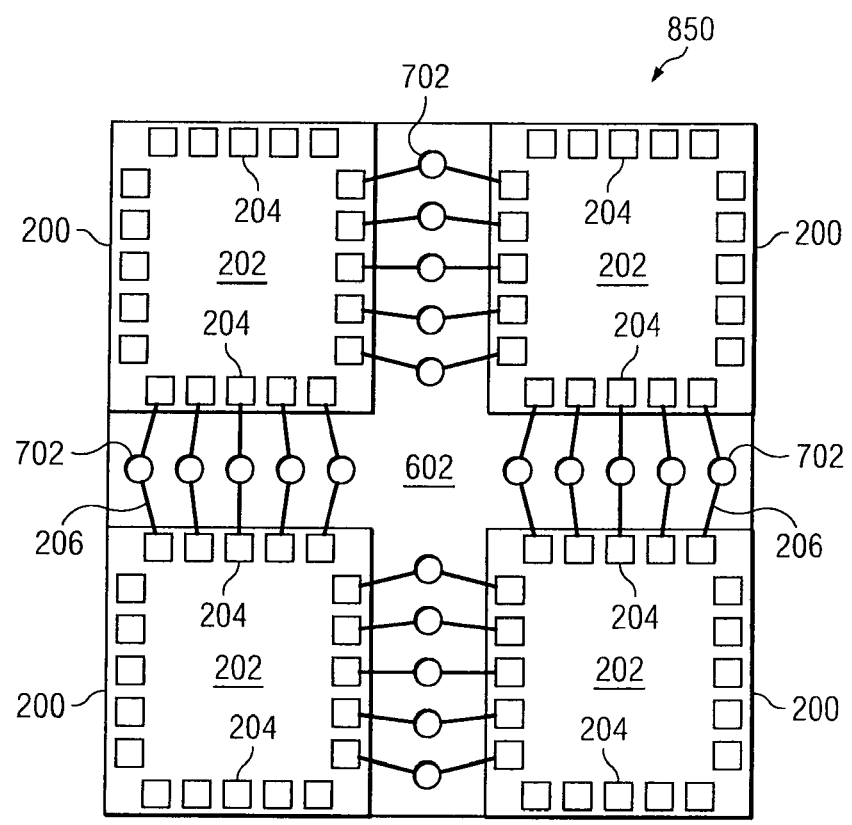

FIGS. 16A and 16B illustrate a seventh step 850 in the second exemplary method of manufacturing the THV stackable semiconductor device as shown in FIGS. 2A and 2B in a side and top view, respectively. Step 850 is again similar to that shown in FIGS. 8A and 8B of metal patterning of metal traces 206 to electrically couple bond pad 204 locations to via 702 locations.

Figure 17A:
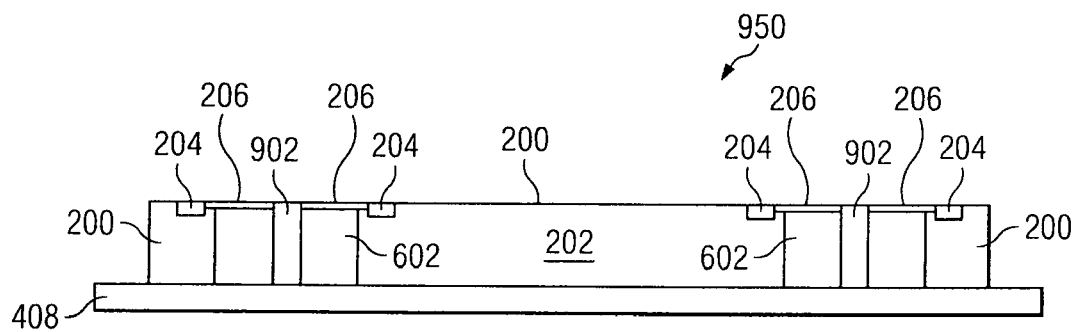
FIGS. 17A and 17B illustrate an eighth step in a second exemplary method of manufacturing the THV stackable semiconductor device as shown in FIGS. 2A and 2B in a side and top view, respectively.
Figure 17B:
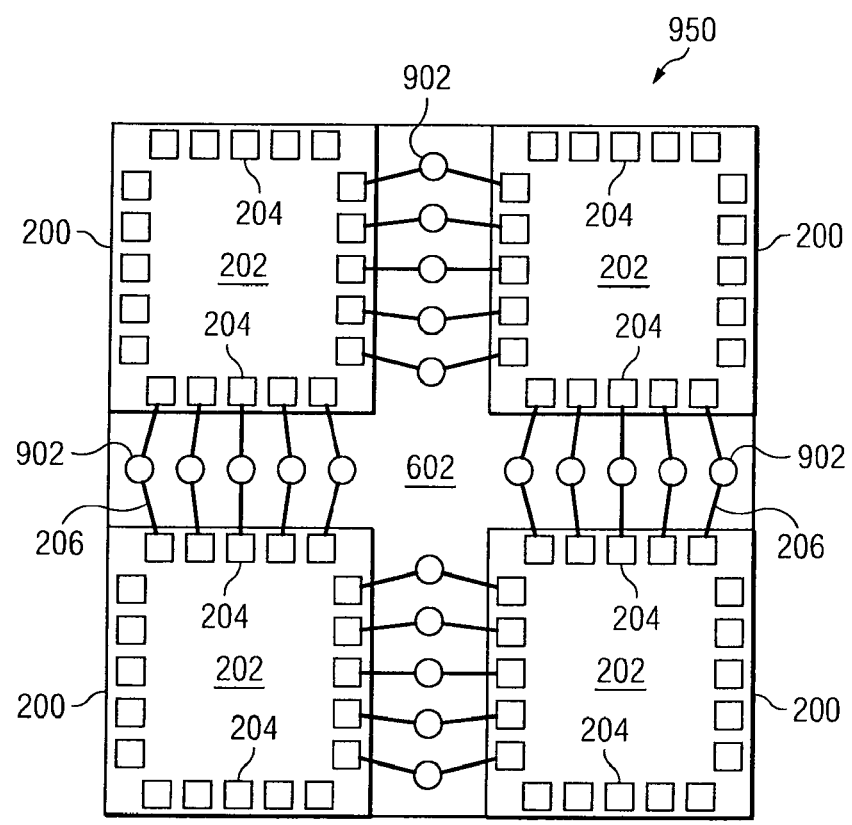

FIGS. 17A and 17B illustrate an eighth step 950 in the second exemplary method of manufacturing the THV stackable semiconductor device as shown in FIGS. 2A and 2B. Vias 702 are plugged, plated or otherwise deposited with a conductive material to fill via holes 702 and render metal vias 902 as shown.

Figure 18A:
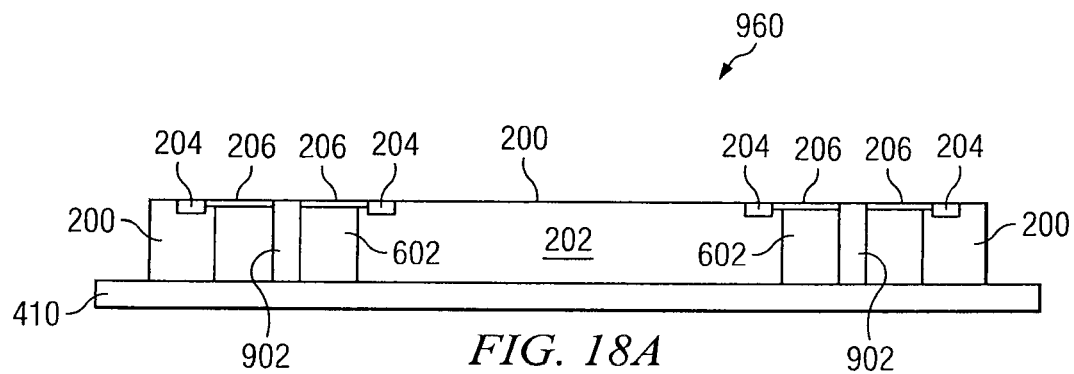
FIGS. 18A and 18B illustrate a ninth step in a second exemplary method of manufacturing the THV stackable semiconductor device as shown in FIGS. 2A and 2B in a side and top view, respectively.
Figure 18B:
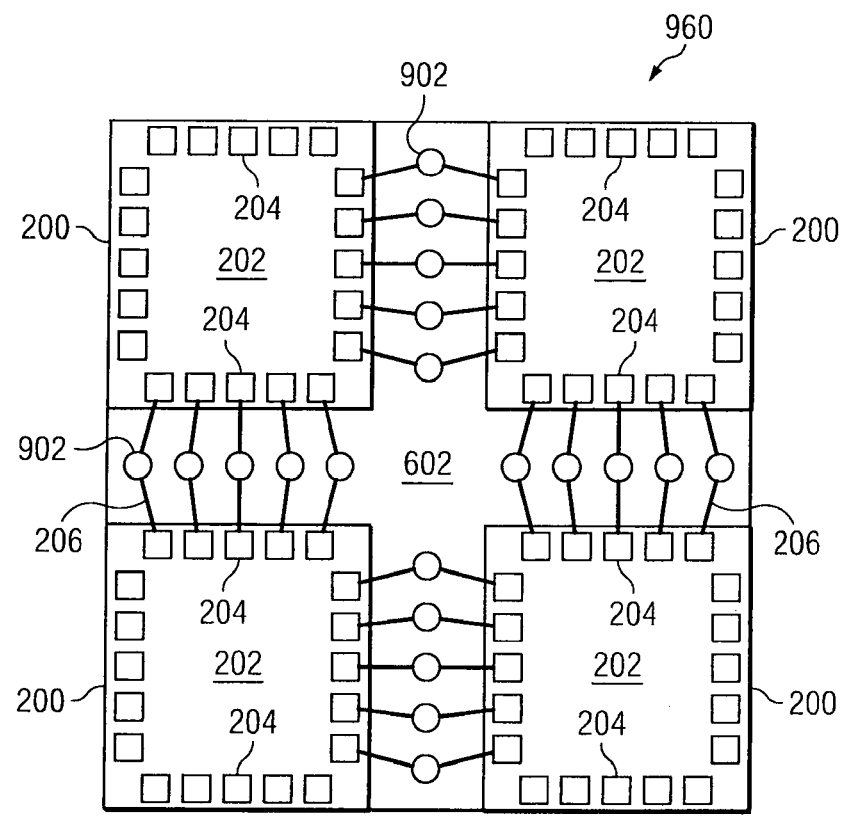

Following the metal via 902 formation process, via hole wafer 960 is transferred onto an additional dicing tape 410 as shown in FIGS. 18A and 18B, which illustrates the depicted ninth step.

Figure 19A:
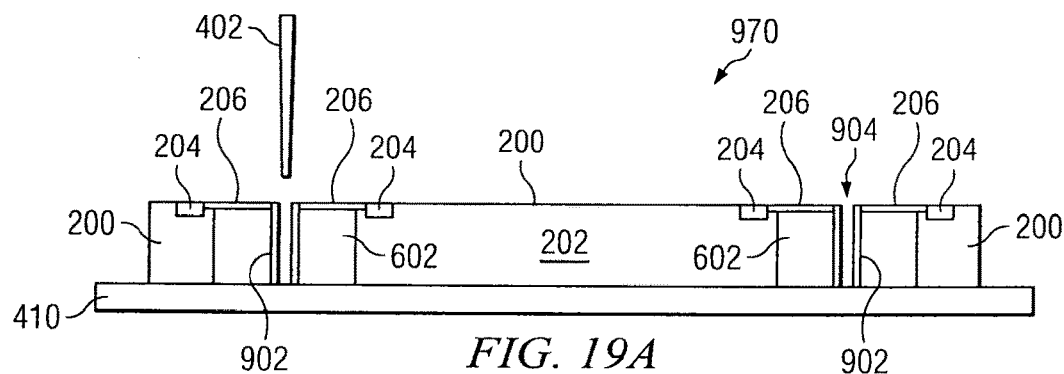
FIGS. 19A and 19B illustrate a tenth step in a second exemplary method of manufacturing the THV stackable semiconductor device as shown in FIGS. 2A and 2B in a side and top view, respectively.
Figure 19B:
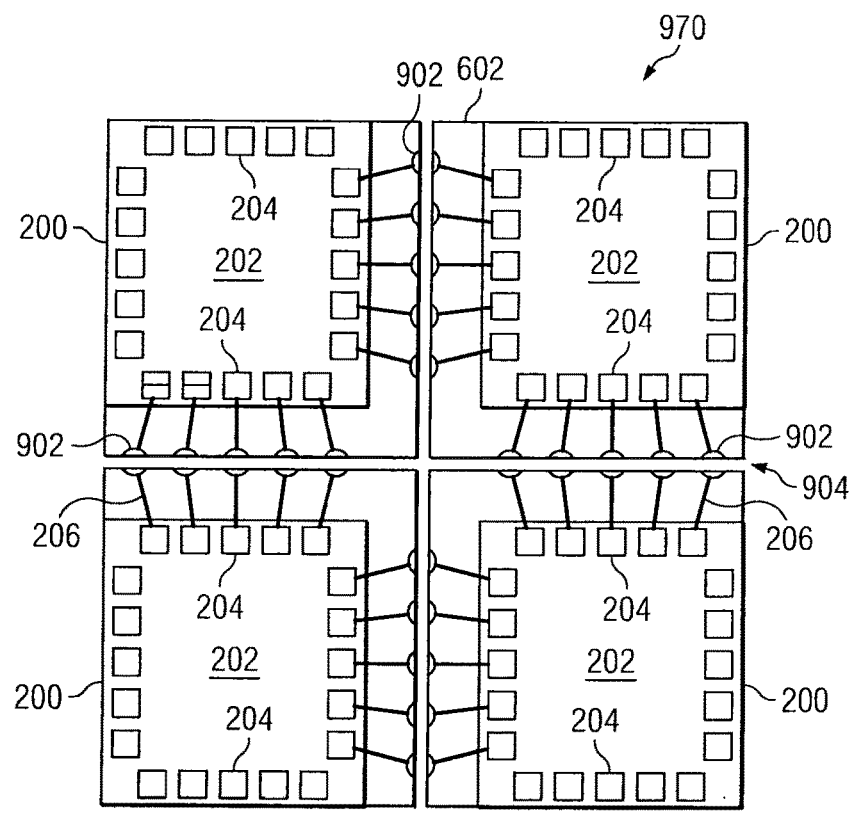

FIGS. 19A and 19B illustrate a tenth step in the second exemplary method of manufacturing the THV stackable semiconductor device as shown in FIGS. 2A and 2B. A cutting tool 402 is again used to singulate via hole wafer 960 into the depicted segments 970, resulting in gaps 904. As a final step, following the second singulation process, a die pick and place machine can be utilized to again remove each device 200 from dicing tape 410.

Figure 20:
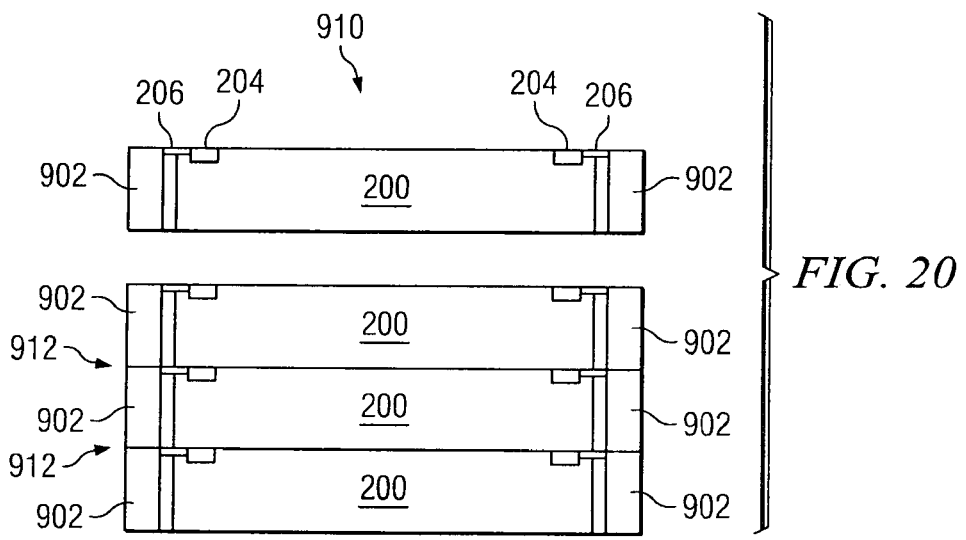
FIG. 20 illustrates a third exemplary embodiment of a THV stackable semiconductor device, shown utilizing a die-to-die stacking configuration in a side view.

FIG. 20 illustrates a third exemplary embodiment of THV stackable semiconductor devices 910, shown utilizing a die-to-die stacking configuration in a side view. A series of devices 200 can be stacked as shown to suit a particular application. Each of the metal vias 902 can be joined together as shown by union 912 using a direct via metal bonding process. Any number of devices 200 can be stacked as shown to realize a desired implementation.

Figure 21:
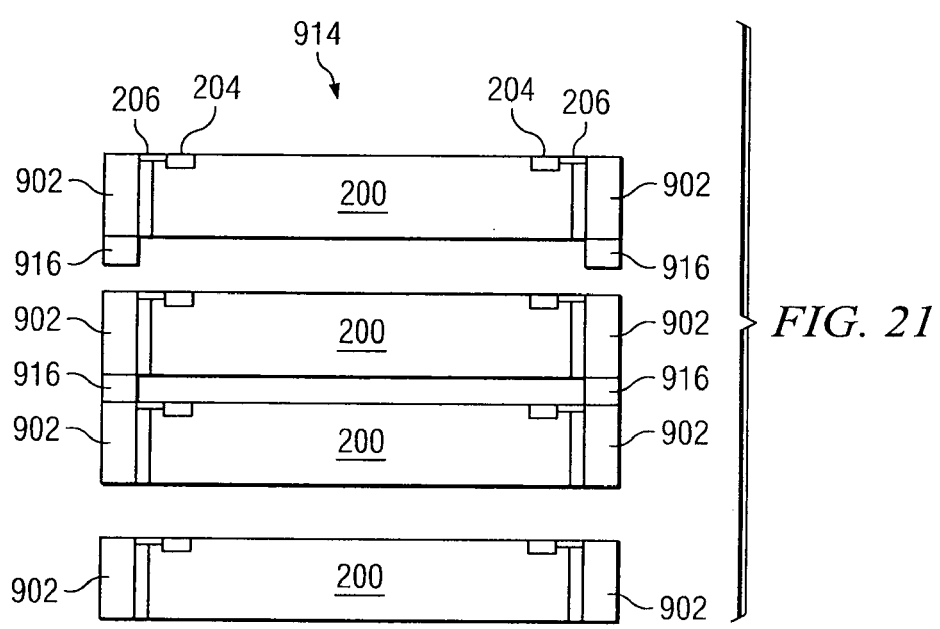
FIG. 21 illustrates a fourth exemplary embodiment of a THV stackable semiconductor device, shown utilizing a die-to-die stacking configuration which incorporates solder paste, again in a side view.

FIG. 21 illustrates a fourth exemplary embodiment of THV stackable semiconductor devices, shown utilizing a die-to-die stacking configuration, which incorporates solder paste 916, again in a side view. Solder paste 916 includes a mix of small solder particles and flux. A variety of solder pastes of various materials can be incorporated. Solder paste 916 can be applied using a reflow soldering method to create a strong metallurgical bond between each of stacked devices 914.

Figure 22:
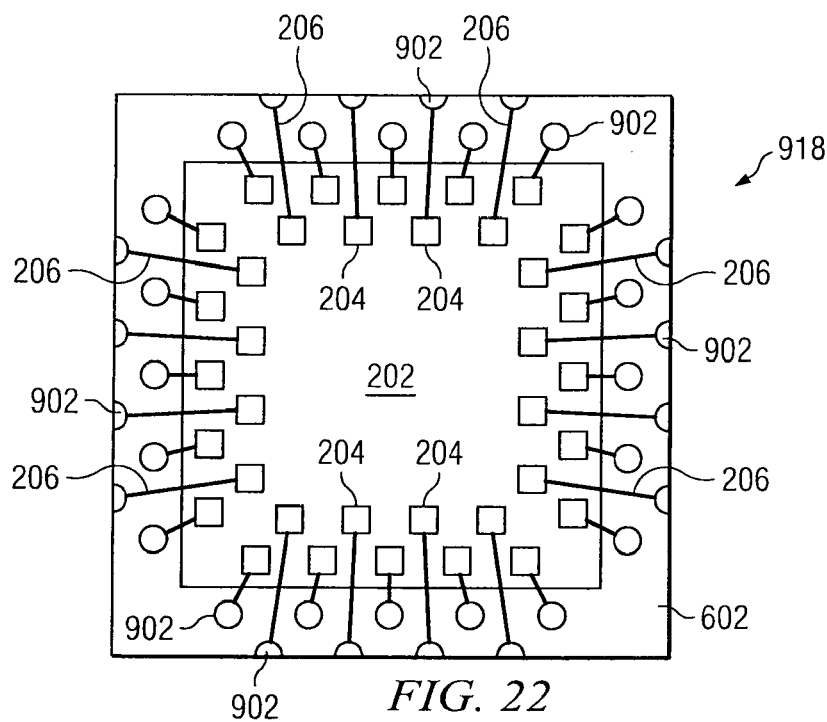
FIG. 22 illustrates a fifth exemplary embodiment of a THV stackable semiconductor device, having multiple rows of bond pads and multiple rows of via holes as shown in a top view.

A fifth exemplary embodiment of a THV stackable semiconductor device 918 is shown in FIG. 22. The present embodiment includes multiple rows of bond pads 204 and multiple rows of via holes 902 as shown in a top view, which are appropriately connected with metal tracings 206. Each of the via holes 902 are disposed in organic material 602 as shown. Any number of configurations of dies 202 having multiple rows of bond pads 204 and multiple rows of via holes 902 can be implemented. In addition to the present embodiment 918, another embodiment can be realized which connects the depicted half-cut outer vias 902 to bond pads 204 which are not located on the active surface of die 202, but on an additional surface, such as an additional die 202 or elsewhere as a specific implementation requires.

Figure 23:
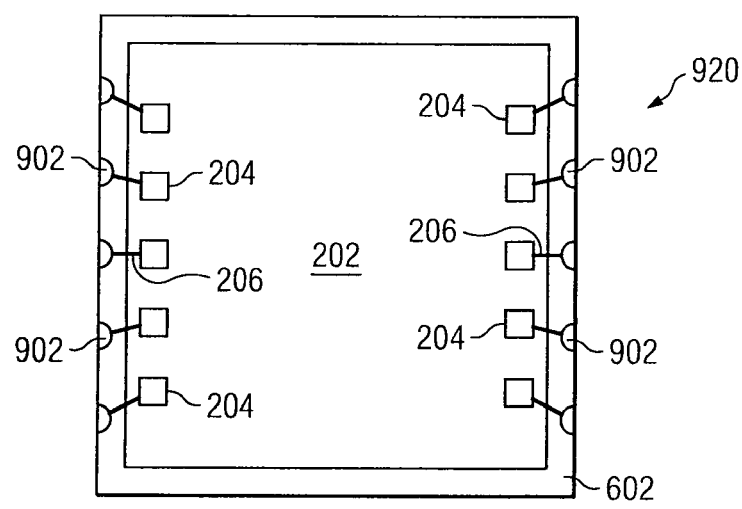
FIG. 23 illustrates a sixth exemplary embodiment of a THV stackable semiconductor device, incorporating a row of half-cut via holes coupled to a row of bond pads on opposing sides of a die as shown in a top view.

A sixth exemplary embodiment of a THV stackable semiconductor device 920 is shown in FIG. 23. Device 920 illustrates an additional configuration of bond pads 204, traces 206, and a series of half-cut vias 902, which are disposed on opposing sides of die 202. The dies 902 are formed in organic material 602, which is disposed on each peripheral side of die 202 as shown. In a variation of the depicted embodiment 920, a configuration can include complete vias 902.

Figure 24:
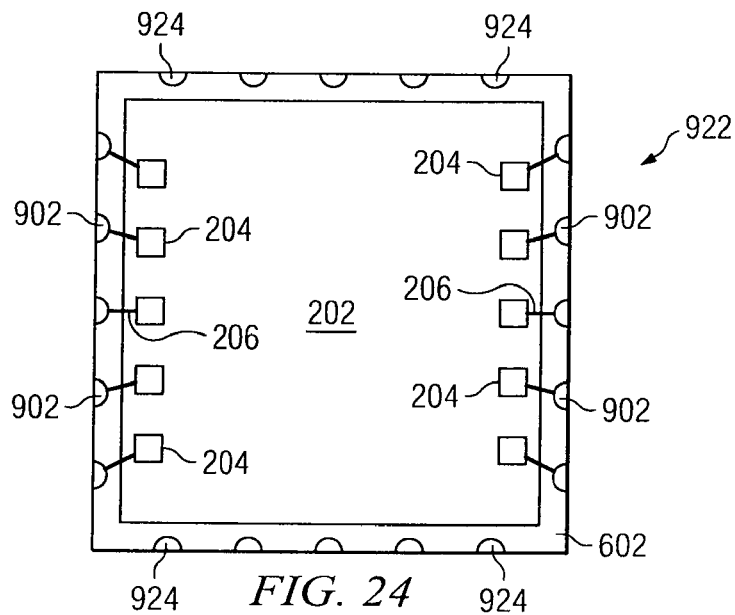
FIG. 24 illustrates a seventh exemplary embodiment of a THV stackable semiconductor device, incorporating dummy via holes on opposing sides as shown in a top view.

A seventh exemplary embodiment of a THV stackable semiconductor device 922 is depicted in FIG. 24. Device 922 includes a series of dummy via holes 924, which are disposed on opposing sides of die 202 as shown. Vias 902 are disposed on the left and right hand side as shown. Dummy via holes 924 can provide for electrical connectivity through device 922 for specific applications. Dummy via holes 924 can be used to connect an additional device 922 or package using a wire-bonding process. In addition, holes 924 can act as a ground or as a conduit for input/output (I/O) signals.

Figure 25:
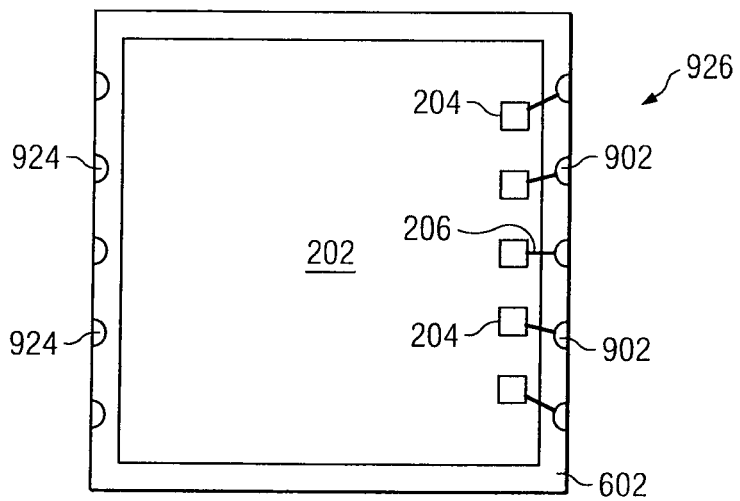
FIG. 25 illustrates an eighth exemplary embodiment of a THV stackable semiconductor device, incorporating dummy via holes on a single side as shown in a top view.

Dummy holes 924 can be configured, as with vias 902, in a variety of implementations. For example, multiple rows, or full or half-cut holes 924 can be implemented. FIG. 25 illustrates one such embodiment of a device 926, which includes a row of half-cut dummy vias 924 on the left side of die 202, and a row of THVs 902, on the right side of die 202, again disposed in organic material 602.

Figure 26:
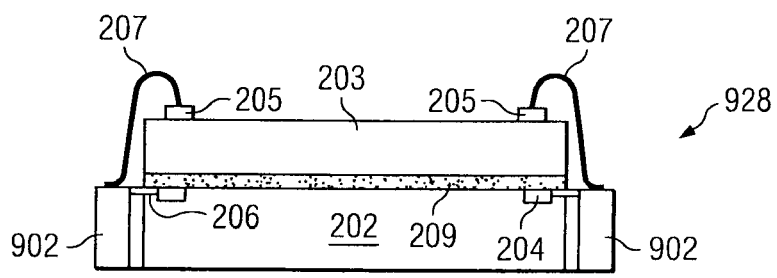
FIG. 26 illustrates a ninth exemplary embodiment of a THV stackable semiconductor device, depicting two stacked dies utilizing the dummy via holes as shown in FIGS. 24 and 25 to connect a top die with a wire-bonding process.

FIG. 26 illustrates a ninth exemplary embodiment of a THV stackable semiconductor device 928, depicting two stacked dies 202 and 203 utilizing dummy via holes 902 as shown in FIGS. 24 and 25 to connect a top die 203 with a wire-bonding process. A series of bond pads 205 is disposed on an active surface of die 203. Wire-bonds 207 connect bond pads 204 to vias 902. A dielectric, insulating or bonding material 209 is disposed between die 202 and die 203 to provide structural support for device/package 928.

Semiconductor devices, such as device 200 incorporating a series of THVs 226 or 902 can provide a variety of functionality and flexibility in various applications. Use of organic material 210 allows placement of vias 226 outside die 202, which allows for additional circuitry within die 202 and enhancing the functionality of device 200. In addition, by using organic material 210 instead of wafer 300 material, the respective yield per wafer is increased. The organic material can be configured to be as thick as needed to accommodate a variety of vias 226 in any number of applications.

Device 200 can be incorporated into a variety of PoP configurations, which make use of THV 226. Such a device can include a semiconductor die having an integrated THV 226. Such a semiconductor die can be referred to as a THV die. Current package-in-package (PiP) packaging techniques make use of wire and/or bump interconnections to provide electrical signals between dies, interposers, and packages. There is growing demand to provide more robust, efficient and space saving interconnections. The use of THV structures like 226, and thereby, THV dies to provide such interconnections can provide more robust, efficient, and space saving interconnections.

Figure 27A:
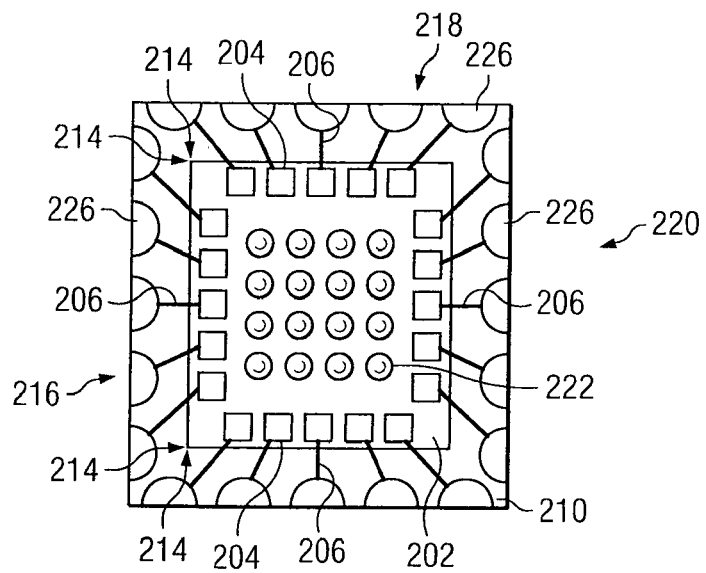
FIG. 27A illustrates an exemplary embodiment of a THV die incorporating a series of redistribution layers (RDLs) and associated interconnection pads as shown in a top-view.

Turning to FIG. 27A, a tenth exemplary embodiment of a THV stackable semiconductor device 220 is shown. THV device 220 includes die 202. An organic material 210 is disposed around peripheral surfaces 214 of die 202. The organic material is disposed along sides 218 and 216, for example, of die 202. Bond pad 204 is formed over a top surface or integrated into a top surface of die 202. Bond pad 204 is connected to THV 226, in which a conductive material is disposed by way of metal traces 206. A series of RDLs and interconnection pads are disposed under bumps 222 in the configuration shown above or integrated into the top surface of die 202. The RDLS and interconnection pads provide for electrical connection terminals for additional dies to be stacked over THV die device 220.

Figure 27B:
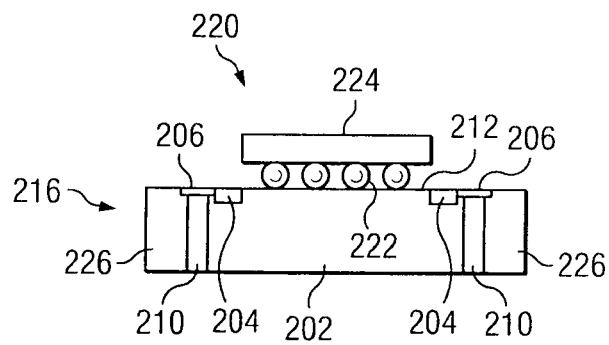
FIG. 27B illustrates the THV die shown in FIG. 27A in a side view with an attached die coupled to the RDLs and interconnection pads.

FIG. 27B illustrates a side-view representation of the THV die configuration 220, including a second semiconductor die 224, which is stacked above THV die 220. The RDLS/interconnect pads are coupled to a series of bumps 222 to electrically connect die 224. THV die 220 incorporates THV structure 226 previously described, which is integrated into organic material 210 disposed around peripheral surfaces of die 202 as shown. A series of bond pads 204 and metal traces 206 provide an electrical path to route signals through via 226 and to the top surface of THV die 220.

Figure 28A:
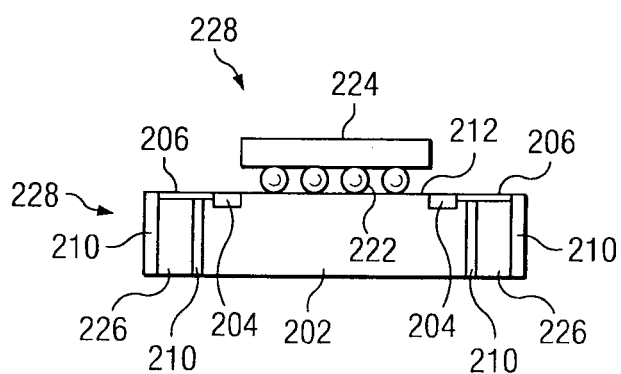
FIG. 28A illustrates a first step in the exemplary method of fabricating a package-on-package (PoP) configuration incorporating an encapsulant and package stacking techniques.

FIG. 28A illustrates a first step 228 in an exemplary method of fabricating a PoP semiconductor device to illustrate encapsulation and package stacking techniques. Device 228 includes THV die 202, which again, incorporates THV 226 integrated into organic material 210. A series of bumps 222 electrically connect a second die or package 224, such as a bumped die or flip chip die, to THV die 202. In one embodiment, bumps 222 are coupled to the RDLs and interconnection pads as shown in FIG. 27A.

Figure 28B:
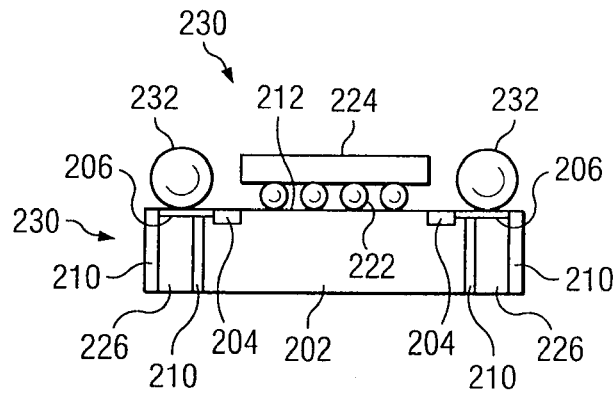
FIG. 28B illustrates a second step in the exemplary method begun with FIG. 28A.
Figure 28C:
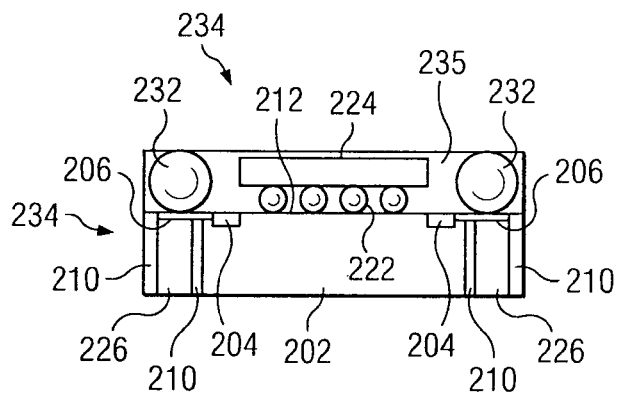
FIG. 28C illustrates a third step in the exemplary method begun with FIG. 28A.

A next step 230 in the exemplary encapsulation and package stacking process is shown in FIG. 28B. Bumps 232 are disposed over a top surface of vias 226 as shown. As a next step 234, shown in FIG. 28C. An encapsulant 235 is disposed over portions of THV die 202 and die 224. A portion of bump 232 is exposed, as is a bottom portion of THV die 202. Various subcomponents such as THV die 202, bump 232, die 224 and bumps 222 are rendered into an integrated circuit package 234 as shown.

Figure 28D:
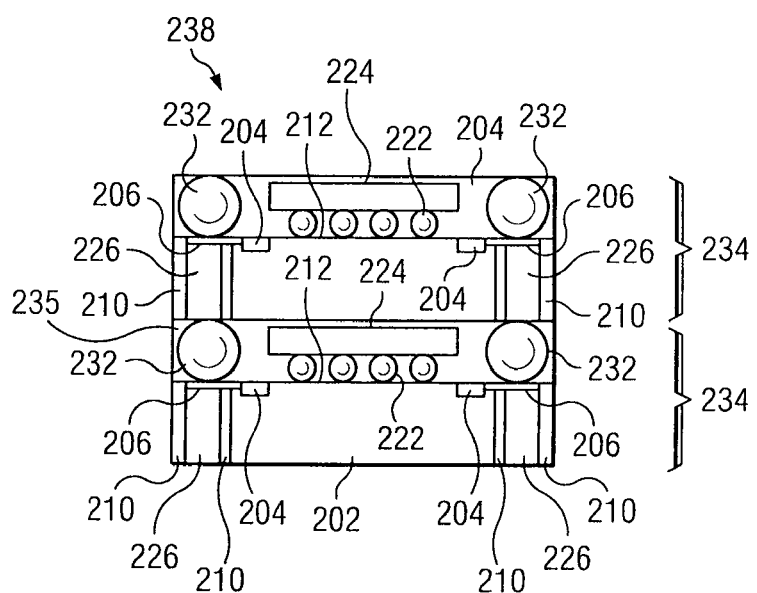
FIG. 28D illustrates a fourth step in the exemplary method begun with FIG. 28A.

As a next step 238, shown in FIG. 28D, a first package 234 is stacked over a second package 234. A top surface of exposed bump 232 of second package 234 is coupled to a bottom surface of through hole via 226 of the first package, and thereby, THV die 202 of the first package. As such, vias 226 of several packages 234 can be connected using a series of partially exposed bumps 232. An encapsulant 235 is disposed over portions of THV die 202 and die 224.

FIGS. 29A-32B illustrate a series of steps in an exemplary method of fabricating a semiconductor device using an exposed ball and die on a package, or using a PoP configuration. FIGS. 29A, 30A, 31A, and 32A illustrate first options in the exemplary method. Similarly, FIGS. 29B, 30B, 31B, and 32B illustrate second options in the exemplary method.

Figure 29A:
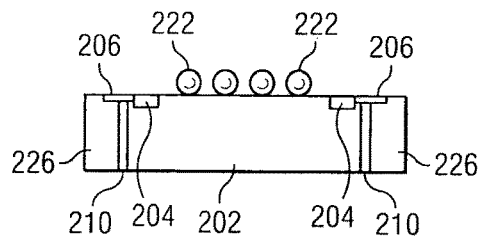
FIGS. 29A and 29B illustrate a first step in an additional exemplary method of fabricating a semiconductor device using an exposed ball and die on package technique or package on package configuration in a first and second option, respectively.
Figure 29B:
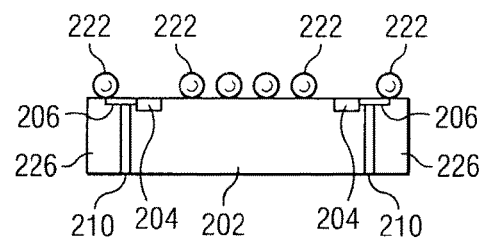

FIG. 29A illustrates the process of providing a series of bumps 222 disposed over THV die 202. In one embodiment, bumps 222 can be coupled to the various RDLs and associated interconnection pads as shown in FIG. 27A. Bumps 222 provide an electrical connection path between THV die 202 and a secondary die or package. FIG. 29B illustrates the additional option of forming bump 222 over the top surface of vias 226 of THV die 202.

Figure 30A:
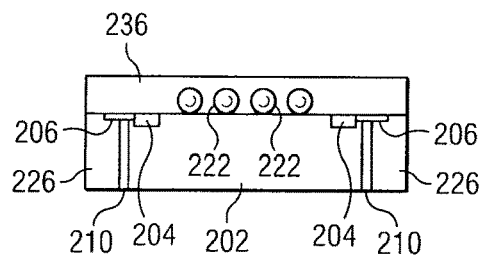
FIGS. 30A and 30B illustrate a second step in the additional exemplary method of fabricating a semiconductor device using an exposed ball and die on package technique or package on package configuration in a first and second option, respectively.
Figure 30B:
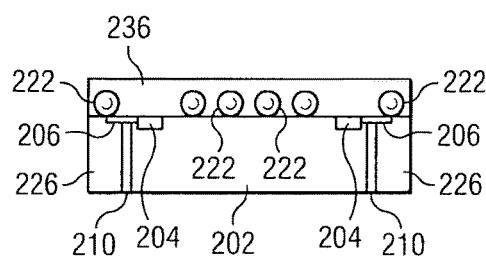

As a next step, FIG. 30A illustrates a process of forming an encapsulant 236 over a portion of THV die 202 and bumps 222. In a similar step, the encapsulant is formed over the bumps in the configuration as shown in FIG. 30B.

Figure 31A:
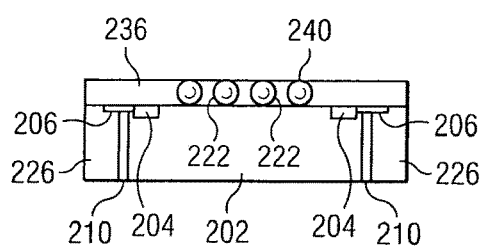
FIGS. 31A and 31B illustrate a third step in the additional exemplary method of fabricating a semiconductor device using an exposed ball and die on package technique or package on package configuration in a first and second option, respectively.
Figure 31B:
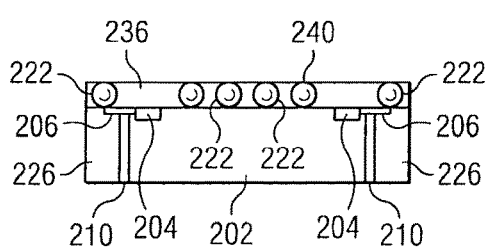

A portion of the encapsulant can then be removed to expose a portion of bumps 222 as shown in FIG. 31A for the first option and 31B for the second option, as denoted by arrows 240. The encapsulant can be removed by a wet etching process, or a chemical-mechanical-polishing (CMP) process.

Figure 32A:
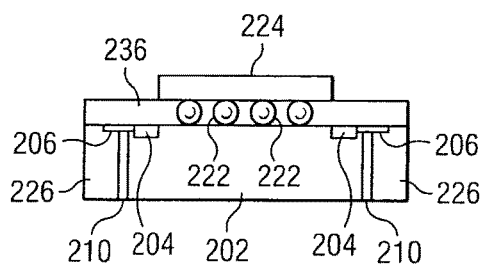
FIGS. 32A and 32B illustrate a fourth step in the additional exemplary method of fabricating a semiconductor device using an exposed ball and die on package technique or package on package configuration in a first and second option, respectively.
Figure 32B:
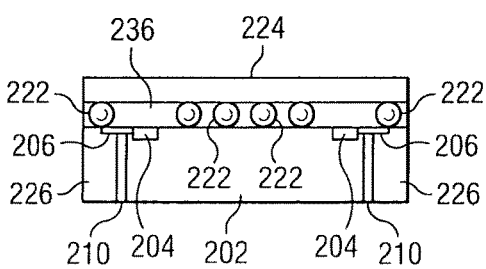

As a final step, a second die 224 or second package 224 is stacked above the exposed bumps, where bumps 222 conduct signals to or from THV die 202 to die or package 224. As shown in FIG. 32A, die 224 is sized appropriately given the respective bumps 222 configuration. Similarly, as shown in FIG. 32B, a larger die or package 224 can be used which extends to the peripheral edges of THV die 202. Vias 226 can be used as a ground, or to route I/O signals to or from die or package 224. The combination of die or package 224, THV die 202, encapsulant 236, and bumps 222 renders an integrated circuit package, which can again be stacked in various configurations to suit particular settings.

FIGS. 33A-36 illustrate another example method of fabricating PoP configurations, incorporating a Fi-PoP implementation. In a similar fashion to FIGS. 29A-32B, FIGS. 33A, 34A, and 35A illustrate a first option, while FIGS. 33B, 34B, and 35B illustrate a second option.

Figure 33A:
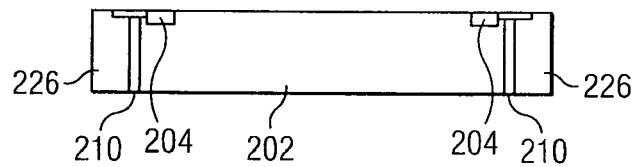
FIGS. 33A and 33B illustrate a first step in an additional exemplary method of fabricating a semiconductor device using a fan-in package-on-package (Fi-PoP) configuration in a first and second option, respectively.
Figure 33B:
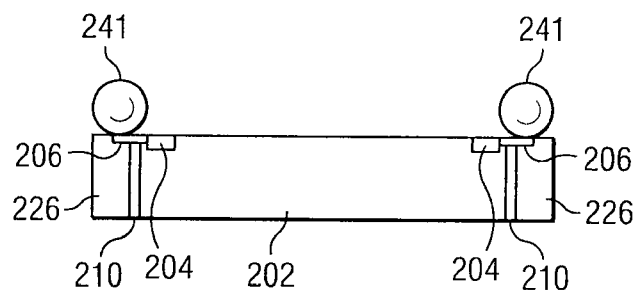
Figure 34A:
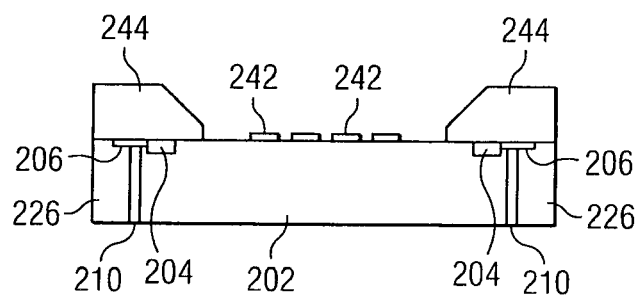
FIGS. 34A and 34B illustrate a second step in the additional exemplary method of fabricating a semiconductor device using a Fi-PoP configuration in a first and second option, respectively.
Figure 34B:
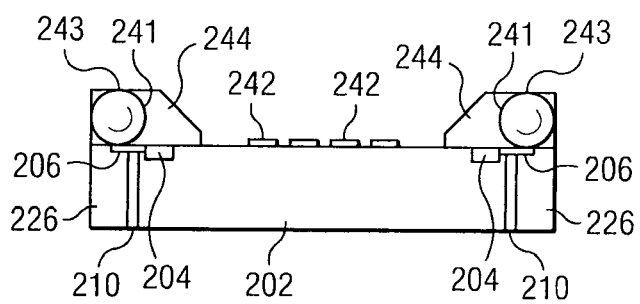

Turning to FIG. 33A, THV die 202 is provided. In an optional embodiment, a series of bumps 241 can be deposited over vias 226, as shown in FIG. 33B. FIG. 34A illustrates the process of forming an encapsulation covering a portion of vias 226, metal traces 206 and bond pads 204 as shown. The encapsulant 244 leaves a top portion of THV die 202 exposed, in order to expose RDLs 242 and/or interconnection pads 242. In addition, a bottom surface of THV die 202 is left exposed. FIG. 34B illustrates a similar step, where encapsulant 244 again is formed over a portion of the THV die, yet the interconnection pads and/or RDLs 242 are left exposed, as is a portion of bumps 241 to provide for electrical connectivity as denoted by arrow 243.

Figure 35A:
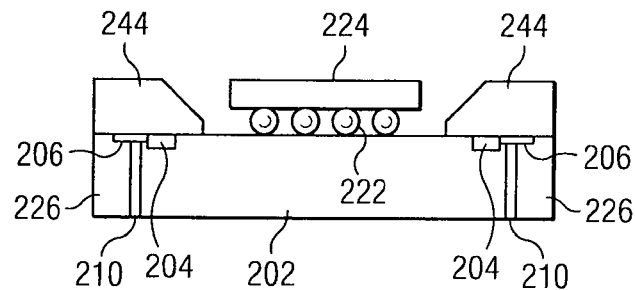
FIGS. 35A and 35B illustrate a third step in the additional exemplary method of fabricating a semiconductor device using a Fi-PoP configuration in a first and second option, respectively.
Figure 35B:
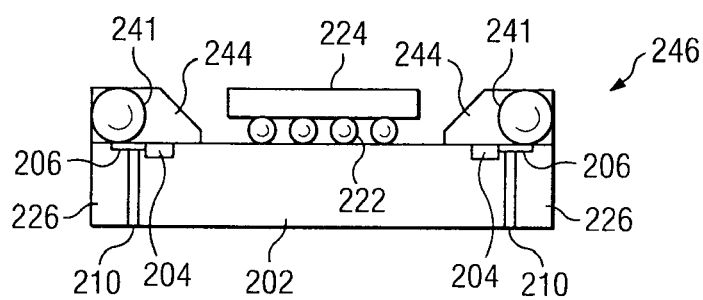

FIG. 35A illustrates the process of stacking a die or package 224 onto THV die 202, where a series of bumps 222 electrically connect package or die 224 to THV die 202 by way of the interconnection pads and/or RDLs. In a similar example, a package or die 224 is attached over the embodiment having bumps 241 as shown in FIG. 35B. Bumps 222 electrically connect die or package 224 to THV die 202 by way of RDLs or interconnection pads.

Figure 36:
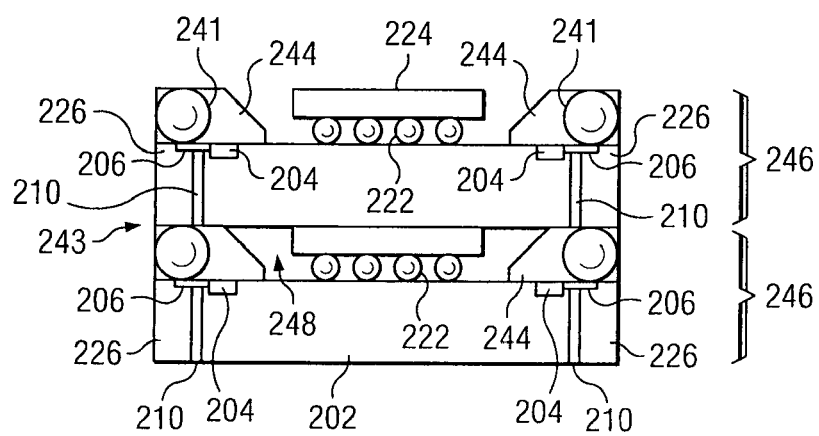
FIG. 36 illustrates a fourth step in the additional exemplary method of fabricating a semiconductor device using a Fi-PoP configuration.

FIG. 36 illustrates a last step in the second optional method disclosed in FIGS. 33B, 34B, and 35B. The integrated circuit package 246 as rendered in FIG. 35B is stacked with an additional package 246, where vias 226 are electrically connected using bumps 241. A gap 248 can result between the two packages, which can be alleviated by use of an optional underfill material.

In some PoP arrangements, both the top and bottom packages are BGA packages, with the top package stacked onto the bottom package. The top package is connected to the bottom package via the bumps between the top and bottom package. These bumps are located around the peripheral of the bottom package.

Fi-PoP refers to embodiments having an inverted package like 260, which is connected to the base substrate via wires. The wires are encapsulated by the molding material and have an exposed middle cavity. The exposed cavity area is able to receive a second package. As the electrical signal from the top second package is transmitted via the center cavity area into the bottom package. Alternatively, the Fi-PoP can have a pre-encapsulated package. The Fi-PoP is attached with an interposer. Wires are added and an encapsulation having the middle cavity is exposed to receive a second package.

Figure 37:
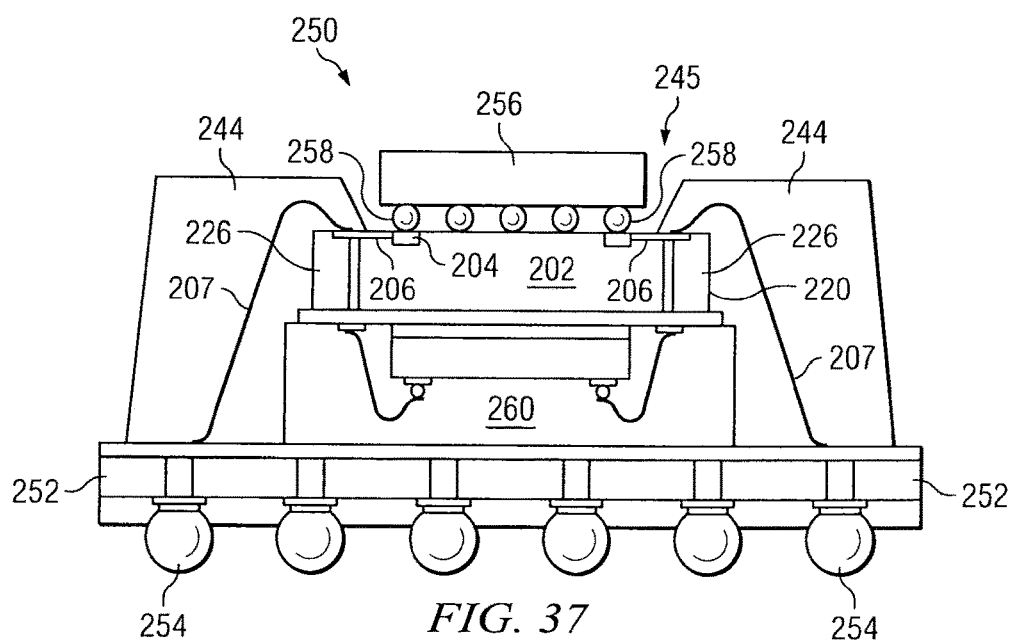
FIG. 37 illustrates an exemplary embodiment of a Fi-PoP configuration incorporating a THV die disposed over an inverted package device.

FIG. 37 illustrates a first exemplary embodiment 250 of a Fi-PoP configuration incorporating THV die 202 disposed over inverted package 260. THV die 202 is oriented such that the integrated circuit layers of THV die 202 are facing upwards. THV die 202 is disposed over circuit carrier substrate 252, or can also be disposed over a leadframe material. In the depicted embodiment, substrate 252 includes a series of bumps 254 to provide electrical connectivity. An additional die or package 256 is disposed above and electrically connected to THV die 202. An encapsulant 244 is disposed over a portion of THV die 202, the inverted package 260, and wire bond 207 coupling THV die 202 to substrate 252. The encapsulant is formed so as to terminate between via 226 and bond pad 204, approximately half way between metal traces 206 as shown. Vias 226 can be used to connect to top integrated circuit or package 256 using wires and/or bump interconnections. In the depicted embodiment, bumps 258 are used to provide the interconnection.

Figure 38:
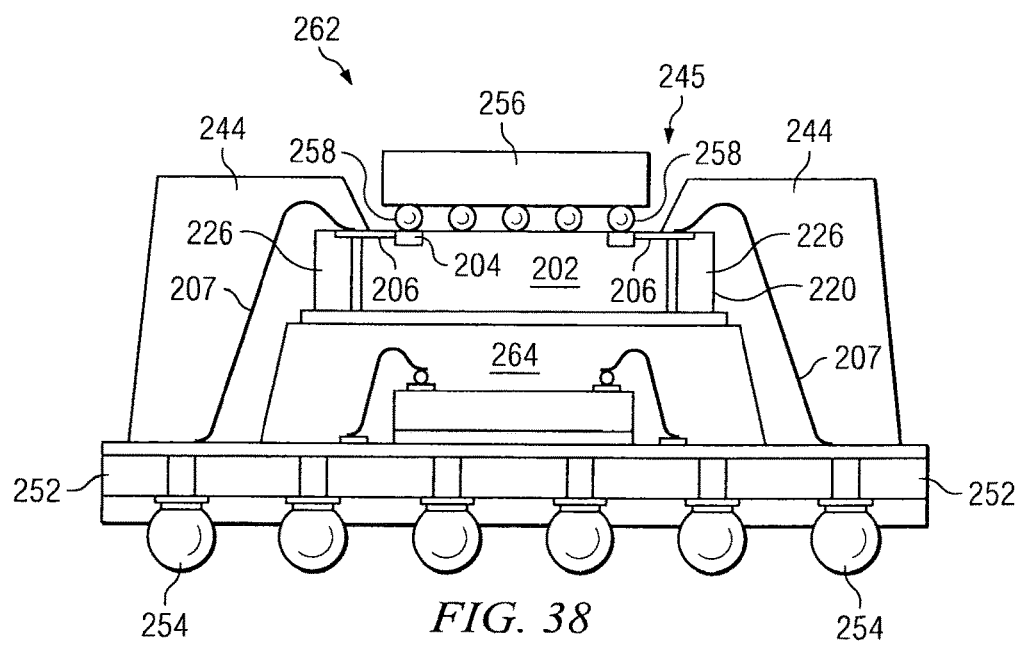
FIG. 38 illustrates an exemplary embodiment of a Fi-PoP configuration incorporating a THV die disposed over a standard package with additional stacking.

FIG. 38 illustrates a second exemplary embodiment 262 of a Fi-PoP configuration, where THV die 202 is disposed above a standard package 264, which is again disposed above circuit carrier substrate or leadframe package 252. THV die 202 is again directly wire-bonded to substrate 252. An additional package or die 256 is again shown electrically connected to THV die 202 by way of bumps 258.

Package or die 256, as shown in many of the Fi-PoP embodiments described throughout, can include such devices as a flip chip bare die, quad flat nonlead (QFN) package, small outline nonlead (SON) package, quad flat package (QFP) land grid array (LGA), ball grid array (BGA), or similar devices and packaging configurations where a known good die is incorporated.

Figure 39:
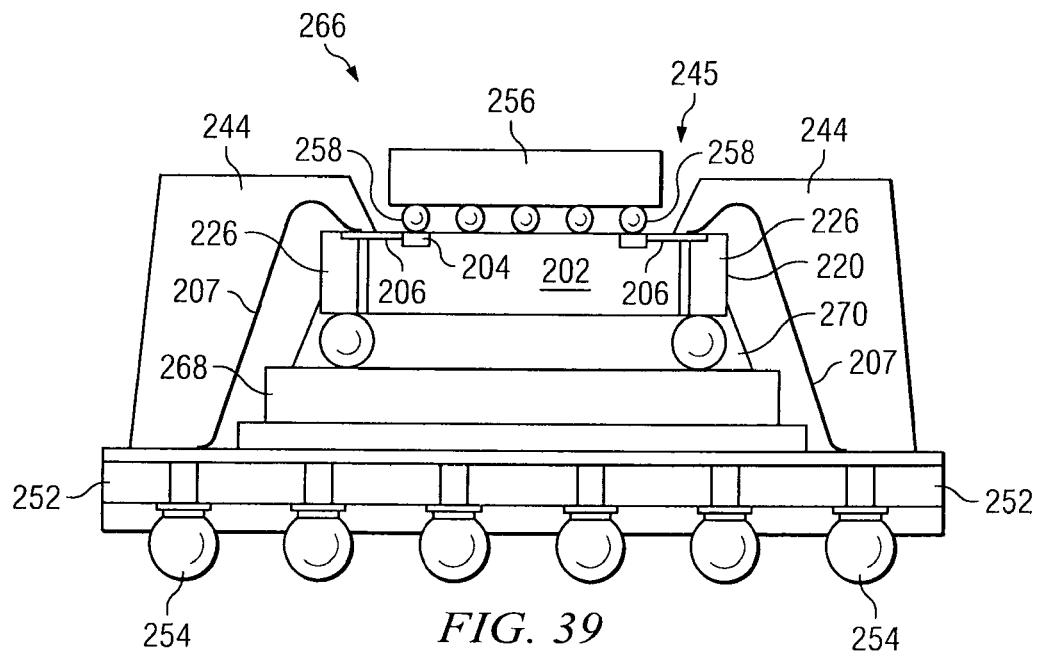
FIG. 39 illustrates an exemplary embodiment of a Fi-PoP device incorporating a THV die disposed over a top-side up flip-chip die.

FIG. 39 illustrates a third embodiment 266 of a Fi-PoP implementation where THV die 202 is incorporated and disposed over a top-side up flip chip die 268. A top die 256 or package 256 is electrically connected to THV die 202 by way of bumps interconnections 258. Underfill material 270 disposed under THV die 202 is optional.

Figure 40:
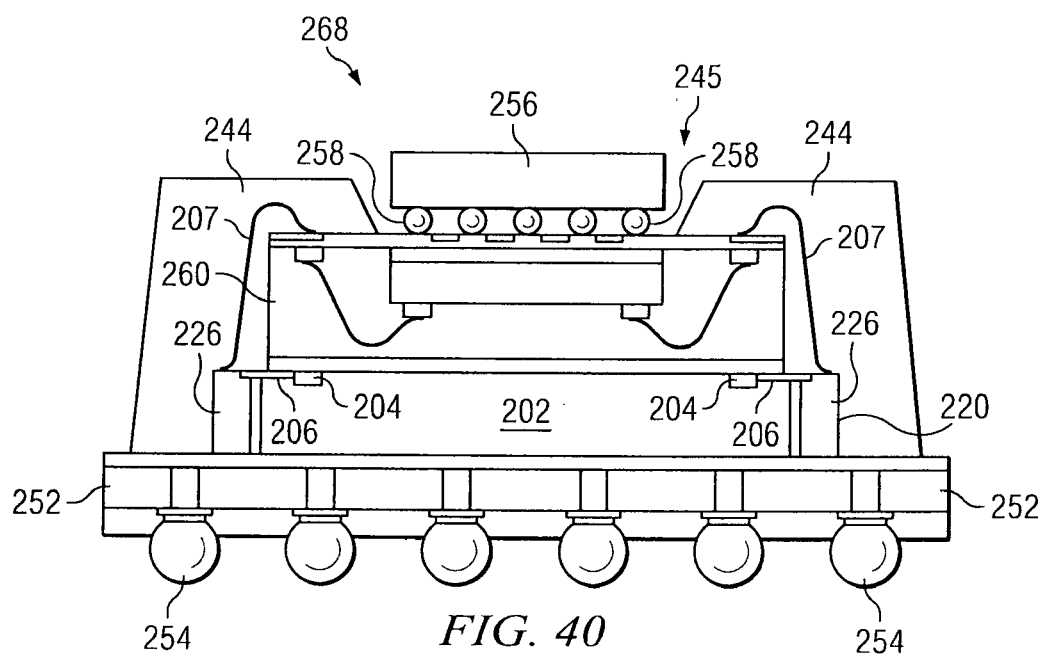
FIG. 40 illustrates an exemplary embodiment of a Fi-PoP device incorporating an inverted package device disposed over a THV die.

FIG. 40 illustrates a fourth embodiment 268 of a Fi-PoP implementation where THV die 202 is located beneath an inverted package, which is wire-bonded using wires 207 to vias 226 as shown. The depicted embodiment further illustrates the flexibility of implementation of THV die 202.

Figure 41:
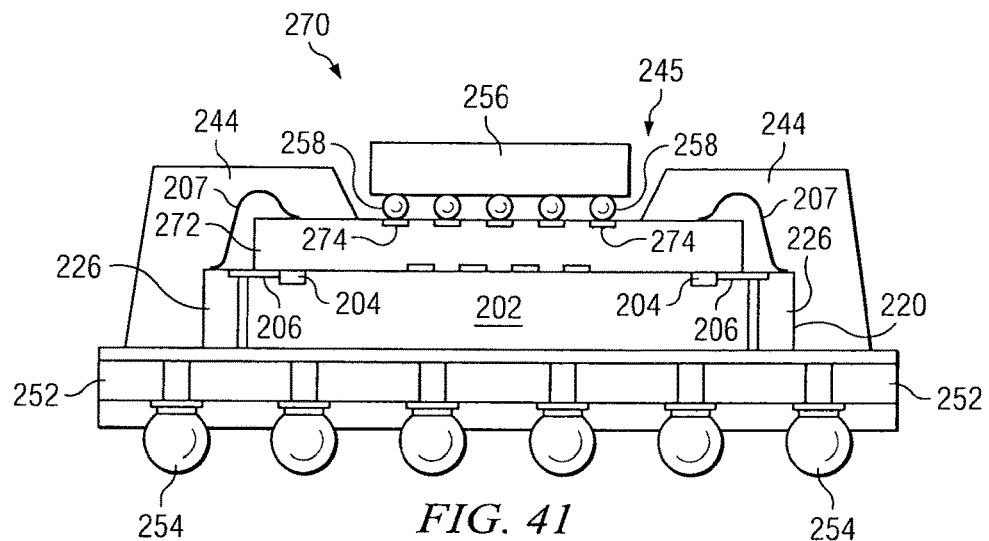
FIG. 41 illustrates an exemplary embodiment of a Fi-PoP device incorporating an interposer structure disposed over a THV die with further stacking.

In a fifth embodiment 270, the THV die can be wire-bonded to an interposer device 272 as shown in FIG. 41. The interposer acts as an interface to route signals between THV die 202 and a top die or package 256. The interposer 272 is wire-bonded to vias 226 in a similar manner to that shown in FIG. 40.

Figure 42:
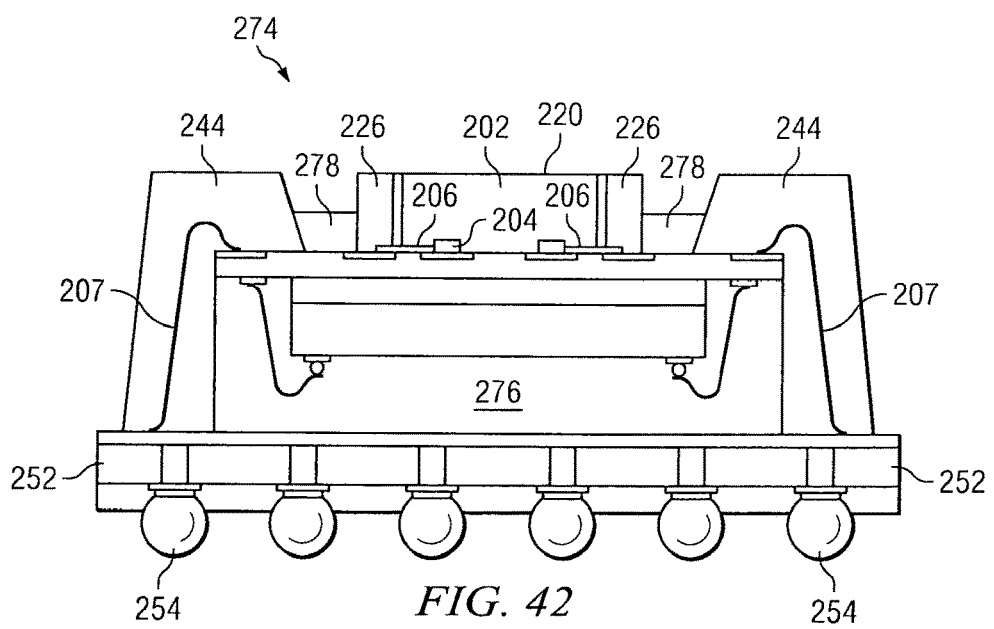
FIG. 42 illustrates an exemplary embodiment of a Fi-PoP device incorporating a THV die disposed on an inverted package.

A sixth embodiment 274 of a Fi-PoP implementation is illustrated by FIG. 42, which shows inverted device 276 which is again disposed above a circuit carrier substrate 252 or can be disposed above a leadframe. A second encapsulant 278 can be optionally disposed between the gap formed between THV die 202 and encapsulant 244. In the depicted embodiment, the THV die is oriented with integrated circuit layers facing downwards in order to electrically contact device 276.

Figure 43:
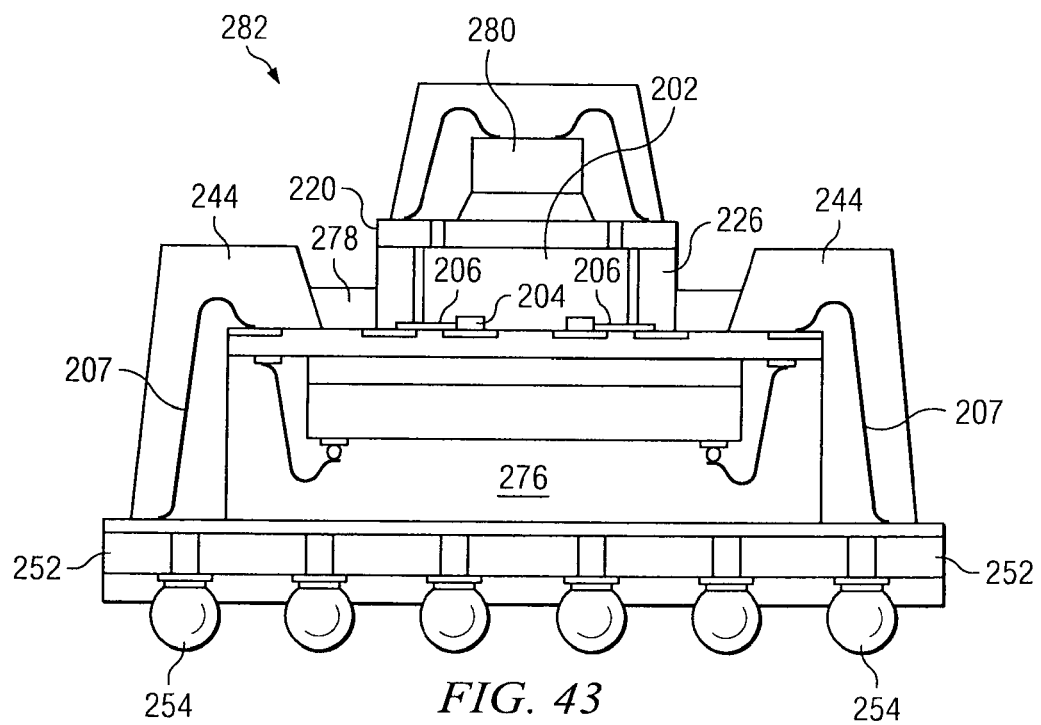
FIG. 43 illustrates an exemplary embodiment of a Fi-PoP package incorporating a THV die disposed over an inverted package with further stacking.

A similar embodiment 282 is shown in FIG. 43, where additional packaging 280 is disposed over THV die 202. Here, the wire bonds of package 280 are connected through vias 226 of THV die 202 in order to electrically connect package 280 to the integrated circuit layers, which face the top surface of device 276. The die 280 can include flip chip bare dies, QFNs, QFPs, SONs, LGAs, BGAs, or other implementations, which incorporate a known good die. The flexibility of THV die 202 allows a variety of such devices to be implemented in combination with THV die 202 to suit particular applications, conform to certain performance specifications, or comply with certain dimensional requirements.

Figure 44:
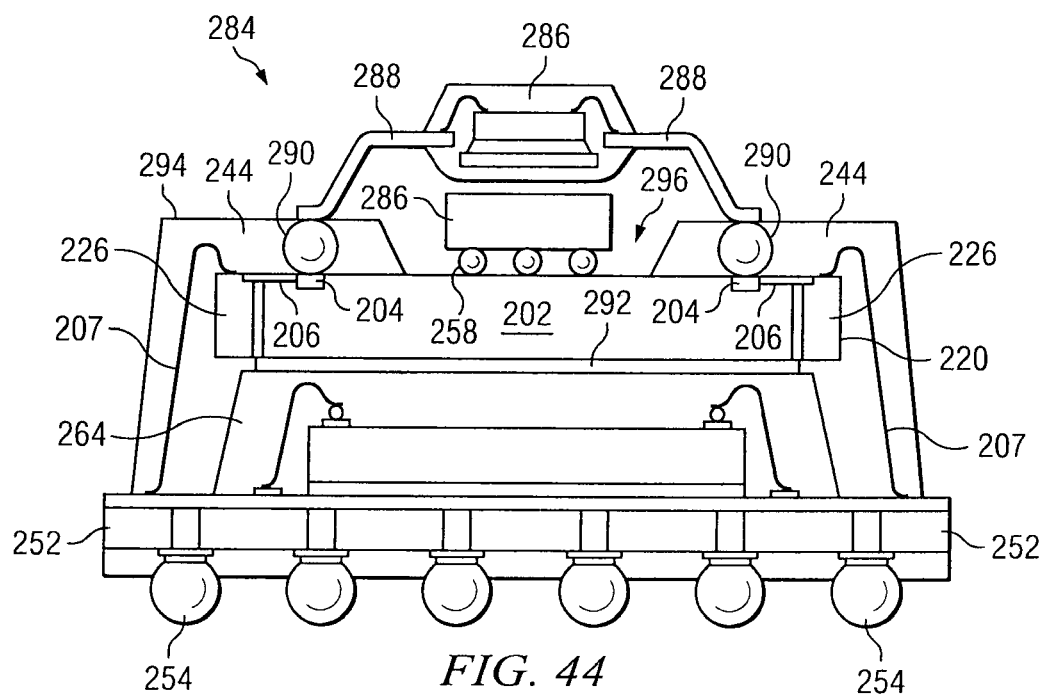
FIG. 44 illustrates an exemplary embodiment of a Fi-PoP package incorporating a THV die with exposed bumps.
Figure 45:
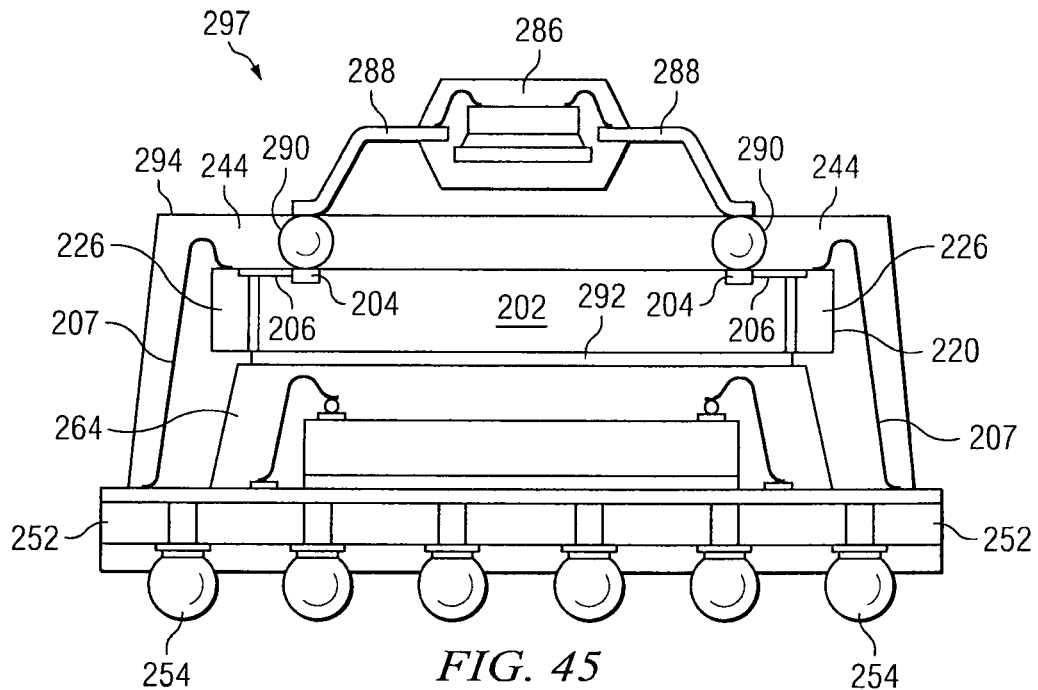
FIG. 45 illustrates an exemplary embodiment of a Fi-PoP package incorporating a THV with exposed bumps in a PoP configuration.

An embodiment 284 of a Fi-PoP illustrates THV die 202, which uses a set of exposed bumps 290 as shown. Bumps 290 connect to leadframe 288 of a package 286, die 286, or similar device, which can again include the various devices as shown in device 280, e.g., BGA, LGA, etc. In the depicted embodiment, THV die 202 overhangs package 264. An encapsulant 244 covers a portion of THV die 202, package 264, and bumps 290 to provide structural support. In a similar embodiment 297 shown in FIG. 45, die 286 directly mounted to the THV die as shown in FIG. 44 is removed, and is replaced with additional encapsulant 244. In either FIG. 44 or FIG. 45, THV die 202 is wire-bonded from vias 226 directly to substrate 252 as shown using wires 207.

Figure 46:
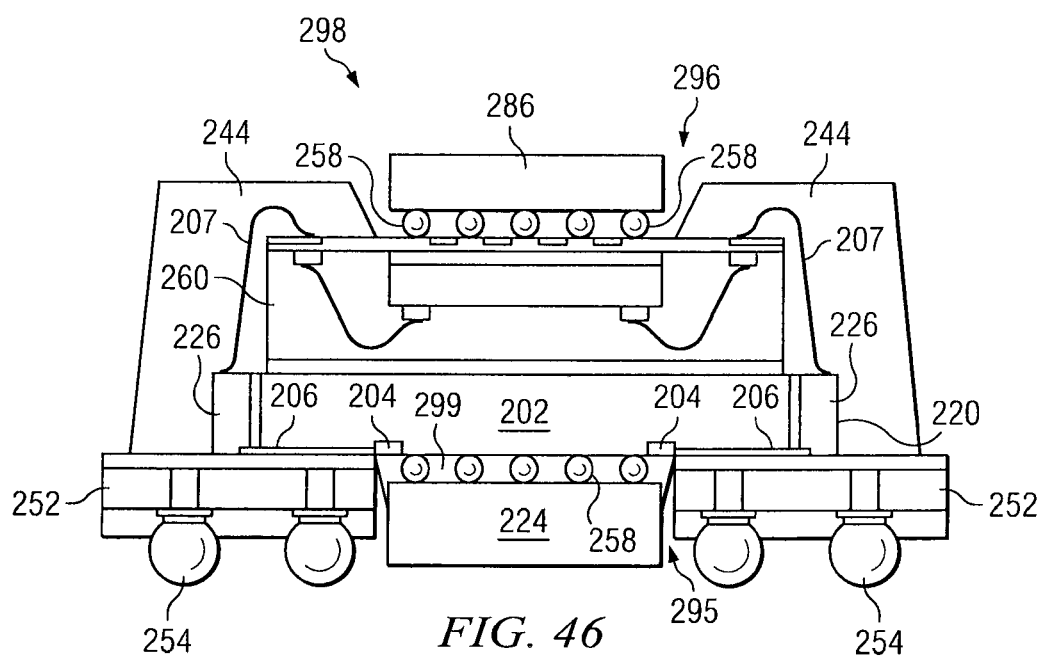
FIG. 46 illustrates an exemplary embodiment of a Fi-PoP package incorporating a THV die on an open cavity substrate receiving a flip chip die.

Turning to FIG. 46, an additional embodiment 298 of a Fi-PoP configuration where THV die 202 is disposed over substrate 252 having an open cavity 295 formed in a portion of substrate 252. The integrated circuit layers of THV die 202 face open cavity 295 of the substrate. An additional die 286 is disposed above an inverted package 260, where die 286 makes use of a series of bumps 258 to electrically connect die 286 to the integrated circuit layers of package 260. The package 260 is coupled to THV die 202 using a die attach (D/A) adhesive material or similar method. Similarly, an additional die 224 is located below the active surface of the THV die, and also coupled to the integrated circuit layers of the THV die using a series of bumps 258. An underfill material 299 can be optionally disposed between bottom die 224 and THV die 202 to provide additional structural support.

As the various embodiments shown in FIGS. 27-46 illustrate, the use of a THV 226, which is incorporated into THV die 202 can provide a variety of flexible options for incorporating various dies and packages. Various dimensional requirements, such as footprint size or height or depth requirements can be satisfied through the use of THV die 202 in various stacked configurations. Use of the THV die in the various embodiments provides an efficient, effective, and robust solution in many cases.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a first semiconductor die singulated from a semiconductor wafer as a first singulated semiconductor die, the first singulated semiconductor die including a plurality of first contact pads;
   a first organic material deposited in a peripheral region outside a footprint of the first singulated semiconductor die over a side surface remaining from singulation and extending from a first surface of the first singulated semiconductor die to a second surface of the first singulated semiconductor die opposite the first surface;
   a plurality of first conductive vias formed through the first organic material in the peripheral region outside the footprint of the first singulated semiconductor die;
   a plurality of conductive traces formed over the first singulated semiconductor die respectively between the first conductive vias and first contact pads;
   a plurality of first bumps formed over the first conductive vias or the first singulated semiconductor die; and
   a second semiconductor die disposed over the first singulated semiconductor die and electrically connected to the first bumps.

2. The semiconductor device of claim 1, further including a plurality of bond wires connected between second contact pads formed over the first singulated semiconductor die and second conductive vias formed through the first organic material.

3. The semiconductor device of claim 1, wherein the second semiconductor die includes:
   a second organic material deposited in a peripheral region of the second semiconductor die; and
   a plurality of second conductive vias formed through the second organic material.

4. The semiconductor device of claim 3, wherein the second semiconductor die further includes:
   a plurality of second bumps formed over the second conductive vias or the second semiconductor die; and
   an encapsulant deposited over a portion of the second bumps.

5. The semiconductor device of claim 1, further including a third semiconductor die disposed over the first singulated semiconductor die.

6. The semiconductor device of claim 1, further including an encapsulant deposited over the first singulated semiconductor die while a portion of the first singulated semiconductor die remains exposed.

7. A semiconductor device, comprising:
a first semiconductor die including an opening in a peripheral region adjacent to the first semiconductor die;
an organic material deposited in the opening in the peripheral region to cover a side surface of the first semiconductor die;
a plurality of first conductive vias formed through the organic material in the peripheral region adjacent to the first semiconductor die;
a first interconnect structure formed over the first conductive vias or the first semiconductor die; and
a first encapsulant deposited over the first interconnect structure.

8. The semiconductor device of claim 7, further including:
a contact pad formed over the first semiconductor die; and
a conductive trace formed over the first semiconductor die.

9. The semiconductor device of claim 7, further including a second semiconductor die disposed adjacent to the first semiconductor die, the organic material deposited in the peripheral region adjacent to the second semiconductor die.

10. The semiconductor device of claim 9, wherein the second semiconductor die further includes
a second interconnect structure formed over the second semiconductor die.

11. The semiconductor device of claim 7, wherein the first conductive vias adjacent to the first semiconductor die include half vias.

12. The semiconductor device of claim 7, wherein a portion of the first semiconductor die is exposed from the first encapsulant.

13. The semiconductor device of claim 7, wherein the first interconnect structure includes a plurality of bumps.

14. A semiconductor device, comprising:
a first semiconductor die singulated from a semiconductor wafer;
a first organic material deposited in a peripheral region of the first semiconductor die;
a first conductive via formed through the first organic material in the peripheral region of the first semiconductor die;
a first interconnect structure formed over the first conductive via or the first semiconductor die; and
a second semiconductor die disposed over the first semiconductor die.

15. The semiconductor device of claim 14, further including an encapsulant deposited over the first interconnect structure.

16. The semiconductor device of claim 15, wherein a portion of the first semiconductor die is exposed from the encapsulant.

17. The semiconductor device of claim 14, further including:
a contact pad formed over the first semiconductor die; and
a conductive trace formed over the first semiconductor die.

18. The semiconductor device of claim 14, wherein the second semiconductor die includes:
a second organic material deposited in a peripheral region of the second semiconductor die; and
a second conductive via formed through the second organic material.

19. The semiconductor device of claim 18, wherein the second semiconductor die further includes:
a second interconnect structure formed over the second conductive via or the second semiconductor die; and
an encapsulant deposited over the second interconnect structure.

20. The semiconductor device of claim 14, wherein the first interconnect structure includes a plurality of bumps.

21. A semiconductor device, comprising a plurality of stacked semiconductor die each including:
an organic material deposited around a peripheral region of the semiconductor die;
a plurality of conductive vias formed through the organic material; and
an interconnect structure formed over the conductive vias or the semiconductor die.

22. The semiconductor device of claim 21, further including an encapsulant deposited over the interconnect structure.

23. The semiconductor device of claim 22, wherein a portion of the semiconductor die is exposed from the encapsulant.

24. The semiconductor device of claim 21, further including:
a contact pad formed over the semiconductor die; and
a conductive trace formed over the semiconductor die.

25. The semiconductor device of claim 21, wherein the interconnect structure includes a plurality of bumps.

26. A semiconductor device, comprising:
a first semiconductor die;
a first organic material deposited in a peripheral region of the first semiconductor die;
a first conductive via formed through the first organic material; and
a first interconnect structure formed over the first conductive via.

27. The semiconductor device of claim 26, further including a second semiconductor die disposed over the first semiconductor die.

28. The semiconductor device of claim 27, wherein the second semiconductor die includes:
a second organic material deposited in a peripheral region of the second semiconductor die; and
a second conductive via formed through the second organic material.

29. The semiconductor device of claim 26, further including an encapsulant deposited over the first interconnect structure.

30. The semiconductor device of claim 29, wherein a portion of the first semiconductor die is exposed from the encapsulant.

* * * * *